US012757566B2

(12) United States Patent
Jang et al.

(10) Patent No.: US 12,757,566 B2
(45) Date of Patent: Oct. 6, 2026

(54) METHOD OF PREPARING QUANTUM DOT, QUANTUM DOT PREPARED THEREBY, AND OPTICAL MEMBER AND ELECTRONIC APPARATUS INCLUDING THE QUANTUM DOT

(71) Applicant: Samsung Display Co., Ltd., Yongin-si (KR)

(72) Inventors: Seunghee Jang, Yongin-si (KR); Kawon Pak, Yongin-si (KR); Seungwon Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 783 days.

(21) Appl. No.: 18/106,604

(22) Filed: Feb. 7, 2023

(65) Prior Publication Data

US 2023/0403875 A1 Dec. 14, 2023

(30) Foreign Application Priority Data

Jun. 14, 2022 (KR) ........................ 10-2022-0072355

(51) Int. Cl.
*C09K 11/62* (2006.01)
*C09K 11/70* (2006.01)
(Continued)

(52) U.S. Cl.
CPC ............ *H10K 50/115* (2023.02); *C09K 11/70* (2013.01); *H10K 59/38* (2023.02); *B82Y 30/00* (2013.01); *B82Y 40/00* (2013.01)

(58) Field of Classification Search
CPC ....... C09K 11/62; C09K 11/70; C09K 11/703; C09K 11/76; C09K 11/025; C09K 11/565;
(Continued)

(56) References Cited

U.S. PATENT DOCUMENTS

| | | | |
|---|---|---|---|
| 7,399,429 | B2 | 7/2008 | Liu et al. |
| 10,550,325 | B2 | 2/2020 | Kan |

(Continued)

FOREIGN PATENT DOCUMENTS

| | | |
|---|---|---|
| JP | 2020-75836 | 5/2020 |
| KR | 10-2014-0121217 | 10/2014 |

(Continued)

OTHER PUBLICATIONS

Wegner et al., "Gallium—a versatile element for tuning the photoluminescence properties of InP quantum dots", Chem. Commun. 55, 1663. (Year: 2019).*

(Continued)

*Primary Examiner* — Matthew E. Hoban
*Assistant Examiner* — Lynne Edmondson
(74) *Attorney, Agent, or Firm* — CANTOR COLBURN LLP

(57) ABSTRACT

Embodiments provide a method of preparing a quantum dot, a quantum dot prepared by the method, and an optical member and electronic apparatus that include the quantum dot. The method of preparing the quantum dot includes preparing a first composition which includes a first precursor including a first element, a second precursor including a second element, a third precursor including a third element, a fatty acid, and a solvent; preparing a second composition including a fourth precursor including a fourth element; preparing a first mixture by mixing the first composition with the second composition; and preparing a core by heating the first mixture.

13 Claims, 2 Drawing Sheets

(51) Int. Cl.

| | |
|---|---|
| ***H10K 50/115*** | (2023.01) |
| ***H10K 59/38*** | (2023.01) |
| *B82Y 30/00* | (2011.01) |
| *B82Y 40/00* | (2011.01) |

(58) Field of Classification Search
CPC .... C09K 11/883; C09K 15/32; H10K 50/115; H10K 50/125; H10K 59/38; H10H 20/812; H10H 20/8512; B82Y 20/00
See application file for complete search history.

(56) References Cited

U.S. PATENT DOCUMENTS

| | | | | |
|---|---|---|---|---|
| 11,180,695 | B2 | 11/2021 | Kim et al. | |
| 2017/0162756 | A1* | 6/2017 | Hartlove | B01J 13/08 |
| 2021/0301202 | A1 | 9/2021 | Ko et al. | |

FOREIGN PATENT DOCUMENTS

| | | |
|---|---|---|
| KR | 10-1739751 | 5/2017 |
| KR | 10-2019-0015516 | 2/2019 |
| KR | 10-2021-0001788 | 1/2021 |
| KR | 10-2021-0122664 | 10/2021 |

OTHER PUBLICATIONS

Korean International Search Report for International Application No. PCT/KR2023/008059, dated Sep. 8, 2023.

Woosuk Lee et al., Synthesis of Blue-Emissive InP/GaP/ZnS Quantum Dots via Controlling the Reaction Kinetics of Shell Growth and Length of Capping Ligands. Nanomaterials 2020, 10, 2171.

Liang Li, et al., One-pot Synthesis of Highly Luminescent InP/ZnS Nanocrystals withoutPrecursor Injection, J. Am. Chem. Soc. 2008, 130, 11588-11589.

Ung Thi Dieu Thuy, et al., Luminescence properties of In(Zn)P alloy core/ZnS shell quantum dots, Applied Physics Letters 97, 193104 (2010); 4 pp.

* cited by examiner

METHOD OF PREPARING QUANTUM DOT, QUANTUM DOT PREPARED THEREBY, AND OPTICAL MEMBER AND ELECTRONIC APPARATUS INCLUDING THE QUANTUM DOT

CROSS-REFERENCE TO RELATED APPLICATION(S)

This application claims priority to and benefits of Korean Patent Application No. 10-2022-0072355 under 35 U.S.C. § 119, filed on Jun. 14, 2022, in the Korean Intellectual Property Office, the entire contents of which are incorporated herein by reference.

BACKGROUND

1. Technical Field

Embodiments relate to a method of preparing a quantum dot, a quantum dot prepared by the method, and an optical member and electronic apparatus that include the quantum dot.

2. Description of the Related Art

Quantum dots may be utilized as materials that perform various optical functions (for example, a light conversion function, a light emission function, and the like) in optical members and various electronic apparatuses. Quantum dots, which are nano-sized semiconductor nanocrystals with a quantum confinement effect, may have different energy bandgaps by control of the size and composition of the nanocrystals, and accordingly, may emit light of various emission wavelengths.

An optical member including such quantum dots may have the form of a thin film, for example, a thin film patterned for each subpixel. Such an optical member may be used as a color-conversion member of a device including various light sources.

The quantum dots may be used for a variety of purposes in various electronic apparatuses. For example, the quantum dots may be used as emitters. For example, the quantum dots may be included in an emission layer of a light-emitting device including a pair of electrodes and the emission layer, and may serve as emitters.

Currently, in order to implement high-definition optical members and electronic apparatuses, there is a need for the development of quantum dots that emit blue light having a maximum emission wavelength of equal to or less than about 490 nm, have high photoluminescence quantum yield (PLQY), and do not include cadmium that is a toxic element.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may include a quantum dot having excellent absorbance and quantum efficiency, a method of preparing the quantum dot, wherein by the method, loss of gallium (Ga) of a core may be prevented during a shell-forming process, and an optical member and an electronic device that include the quantum dot.

Additional aspects will be set forth in part in the description which follows and, in part, will be apparent from the description, or may be learned by practice of the embodiments of the disclosure.

According to embodiments, a method of preparing a quantum dot may include:

- preparing a first composition including a first precursor including a first element, a second precursor including a second element, a third precursor including a third element, a fatty acid, and a solvent;
- preparing a second composition including a fourth precursor including a fourth element;
- preparing a first mixture by mixing the first composition with the second composition; and
- preparing a core by heating the first mixture,
- wherein the first element and the second element may each independently be a Group III element,
- the first element and the second element may be different from each other,
- the third element may be a Group II element,
- the fourth element may be a Group V element,
- the number of carbon atoms in the fatty acid may be in a range of 2 to 15,
- the quantum dot includes the core which may include the first element, the second element, and the fourth element,
- a number of moles of the first element may be $n^1$,
- a number of moles of the second element may be $n^2$,
- a number of moles of the fourth element may be $n^4$, and
- a ratio of a sum of the number of moles of the first element and the number of moles of the second element to the number of moles of the fourth element in the core ($(n^1+n^2)n^4$) may be in a range of about 1.0 to about 2.0.

According to an embodiment, the method may further include, following the preparing of the core, preparing a shell covering at least a portion of the core.

According to an embodiment, a ratio of the number of moles of the fourth element to the sum of the number of moles of the first element and the number of moles of the second element in the first mixture ($n^4/(n^1+n^2)$) may be in a range of about 0.5 to about 0.9.

According to an embodiment, a first exciton peak of a UV-Vis spectrum of the core may have a wavelength in a range of about 350 nm to about 450 nm.

According to an embodiment, the first element and the second element may each independently include scandium (Sc), aluminum (Al), gallium (Ga), indium (In), thallium (Tl), or any combination thereof.

According to an embodiment, the third element may include beryllium (Be), magnesium (Mg), calcium (Ca), strontium (Sr), barium (Ba), zinc (Zn), cadmium (Cd), mercury (Hg), or any combination thereof.

According to an embodiment, the fourth element may include vanadium (V), niobium (Nb), nitrogen (N), phosphorus (P), arsenic (As), antimony (Sb), or any combination thereof.

According to an embodiment, the number of carbon atoms in the fatty acid may be in a range of 6 to 12.

According to an embodiment, the fatty acid may include caprylic acid, capric acid, or lauric acid.

According to an embodiment, a number of moles of the third element may be $n^3$, and a ratio of the number of moles of the third element to the number of moles of the first element in the first mixture ($n^3/n^1$) may be greater than 0 and less than or equal to 2.0.

According to an embodiment, a ratio of the number of moles of the second element to the number of moles of the first element in the first mixture ($n^2/n^1$) may be greater than or equal to 0.05 and less than or equal to 5.

According to an embodiment, the core may be represented by Formula 1, which is explained below.

According to an embodiment, the core may have a diameter in a range of about 1.5 nm to about 3.0 nm.

According to embodiments, a quantum dot may be prepared by the method, which is described herein.

According to an embodiment, the core of the quantum dot may be represented by Formula 2, which is explained below.

According to an embodiment, a mass extinction coefficient for a wavelength of 450 nm may be in a range of about 250 $mL \cdot g^{-1} \cdot cm^{-1}$ to about 450 $mL \cdot g^{-1} \cdot cm^{-1}$.

According to embodiments, an optical member may include the quantum dot.

According to embodiments, an electronic apparatus may include the quantum dot.

According to an embodiment, the electronic apparatus may further include: a light source; and a color conversion member arranged in a path of light emitted from the from the light source, wherein the color conversion member may include the quantum dot.

According to an embodiment, the electronic apparatus may further include a light-emitting device including: a first electrode; a second electrode; and an emission layer between the first electrode and the second electrode, wherein the light-emitting device may include the quantum dot.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects, and features of the disclosure will be more apparent by describing in detail embodiments thereof with reference to the accompanying drawings, in which.

DETAILED DESCRIPTION OF THE EMBODIMENTS

Figure 1:
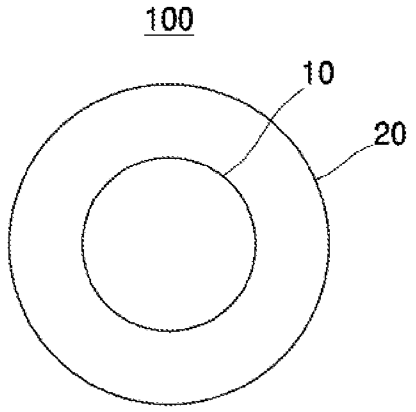
FIG. 1 is a schematic cross-sectional view of a quantum dot according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The term "Group II" as used herein may be a Group IIA element or a Group IIB element on the IUPAC periodic table, and examples of the Group II element may include magnesium (Mg), calcium (Ca), zinc (Zn), cadmium (Cd), mercury (Hg), and the like.

The term "Group III" as used herein may be a Group IIIA element or a Group IIIB element on the IUPAC periodic table, and examples of the Group III element may include aluminum (Al), gallium (Ga), indium (In), thallium (Tl), and the like.

The term "Group V" as used herein may be a Group VA element or a Group VB element on the IUPAC periodic table, and examples of the Group V element may include nitrogen (N), phosphorus (P), arsenic (As), antimony (Sb), and the like.

The term "Group VI" as used herein may be a Group VIA element or a Group VIB element on the IUPAC periodic table, and examples of the Group VI element may include sulfur (S), selenium (Se), tellurium (Te), and the like.

The term "mass extinction coefficient" as used herein may be light absorption of quantum dots with respect to light of a specific wavelength quantified as a weight ratio, and may be calculated based on the Lambert-Beer law as shown in Equation 1. The "mass" of the term "mass extinction coefficient" as used herein may be a weight in grams. The mass extinction coefficient may be defined as Equation 1:

$$\text{Mass extinction coefficient } (a)=A/c\cdot L \quad \text{[Equation 1]}$$

In Equation 1, A represents absorbance, c represents a concentration of a sample solution (g/m L), and L represents the length of the sample solution (cm).

The term "quantum dot" as used herein may be a crystal of a semiconductor compound, and may include any material capable of emitting light of various emission wavelengths according to the size of the crystal.

In the specification, $n^1$ refers to the number of moles of the first element, $n^2$ refers to the number of moles of the second element, $n^3$ refers to the number of moles of the third element, and $n^4$ refers to the number of moles of the fourth element.

In the specification, $n^{In}$ refers to the number of moles of In, $n^{Ga}$ refers to the number of moles of Ga, and $n^P$ refers to the number of moles of P.

Hereinafter, a quantum dot 100 according to an embodiment will be described with reference to FIG. 1.

[Quantum Dot 100]

An embodiment may include a quantum dot 100 including a core 10.

In an embodiment, the quantum dot 100 may further include a shell 20 covering at least a portion of the core 10.

In an embodiment, the quantum dot 100 may be prepared by a method of preparing a quantum dot to be described below.

In an embodiment, the core 10 may include a first element, a second element, and a fourth element.

In an embodiment, the first element and the second element may each independently include a Group III element, and may be different from each other.

In an embodiment, the third element may include a Group II element.

In an embodiment, the fourth element may include a Group V element.

In an embodiment, a ratio of a sum of the number of moles of the first element and the number of moles of the second element to the number of moles of the fourth element in the core 10 ($(n^1+n^2)/n^4$) may be in a range of about 1.0 to about 2.0. For example, the core 10 may include indium (In), gallium (Ga), and phosphorus (P), and a ratio of a sum of the number of moles of In and the number of moles of Ga to the number of moles of P ($(n^{In}\pm n^{Ga})/n^P$) may be in a range of about 1.0 to about 2.0.

For example, the ratio of the sum of the number of moles of the first element and the number of moles of the second element to the number of moles of the fourth element in the core 10 ($(n^1+n^2)/n^4$) may be in a range of about 1.0 to about 2.0. For example, $(n^1+n^2)/n^4$ may be in a range of about 1.0 to about 1.9. For example, $(n^1+n^2)/n^4$ may be in a range of about 1.0 to about 1.8. For example, $(n^1+n^2)/n^4$ may be in a range of about 1.0 to about 1.7. For example, $(n^1+n^2)/n^4$ may be in a range of about 1.1 to about 1.9. For example, $(n^1+n^2)/n^4$ may be in a range of about 1.2 to about 1.9. For example, $(n^1+n^2)/n^4$ may be in a range of about 1.2 to about 1.8. For example, $(n^1+n^2)/n^4$ may be in a range of about 1.2 to about 1.7.

In an embodiment, the core 10 of the quantum dot 100 may be represented by Formula 1:

$$M^1_xM^2_{1-x}M^4_y \quad \text{[Formula 1]}$$

In Formula 1, $M^1$ may be the first element, $M^2$ may be the second element, $M^4$ may be the fourth element, x may be a real number greater than 0 and less than 1, and y may be a real number greater than 0 and less than or equal to 1, and may satisfy $1.0\leq 1/y<2.0$.

In an embodiment, y may satisfy $1.0<1/y<2.0$.

In an embodiment, the core 10 of the quantum dot 100 may be represented by Formula 2:

$$In_xGa_{1-x}P_y \quad \text{[Formula 2]}$$

In Formula 2, x may be a real number greater than 0 and less than 1, and y may be a real number greater than 0 and less than or equal to 1, and may satisfy $1.0\leq 1/y<2.0$.

In an embodiment, the core 10 may have a diameter in a range of about 1.5 nm to about 3.0 nm. For example, the core 10 may have a diameter in a range of about 1.5 nm to about 2.5 nm. For example, the core 10 may have a diameter in a range of about 1.6 nm to about 2.4 nm. For example, the core 10 may have a diameter in a range of about 1.7 nm to about 2.3 nm. For example, the core 10 may have a diameter in a range of about 1.8 nm to about 2.2 nm.

In an embodiment, a first exciton peak of a UV-Vis spectrum of the core 10 may have a wavelength in a range of about 350 nm to about 450 nm.

For example, the first exciton peak of the UV-Vis spectrum of the core 10 may have a wavelength in a range of about 350 nm to about 450 nm. For example, the first exciton peak of the UV-Vis spectrum of the core 10 may have a wavelength in a range of about 360 nm to about 450 nm. For example, the first exciton peak of the UV-Vis spectrum of the core 10 may have a wavelength in a range of about 360 nm to about 440 nm. For example, the first exciton peak of the UV-Vis spectrum of the core 10 may have a wavelength in a range of about 370 nm to about 450 nm. For example, the first exciton peak of the UV-Vis spectrum of the core 10 may have a wavelength in a range of about 380 nm to about 450 nm. For example, the first exciton peak of the UV-Vis spectrum of the core 10 may have a wavelength in a range of about 390 nm to about 450 nm. For example, the first exciton peak of the UV-Vis spectrum of the core 10 may have a wavelength in a range of about 400 nm to about 450 nm. For example, the first exciton peak of the UV-Vis spectrum of the core 10 may have a wavelength in a range of about 410 nm to about 450 nm. For example, the first exciton peak of the UV-Vis spectrum of the core 10 may have a wavelength in a range of about 420 nm to about 440 nm.

In an embodiment, the shell 20 may be included or omitted.

In an embodiment, the quantum dot 100 may have a weight absorption coefficient at a wavelength of 450 nm of greater than or equal to about 250 $mL \cdot g^{-1} \cdot cm^{-1}$.

For example, the quantum dot 100 may have a mass extinction coefficient at a wavelength of 450 nm of greater than or equal to 250 $mL \cdot g^{-1} \cdot cm^{-1}$. For example, the quantum dot 100 may have a mass extinction coefficient at a wavelength of 450 nm of greater than or equal to 260 $mL \cdot g^{-1} \cdot cm^{-1}$. For example, the quantum dot 100 may have a mass extinction coefficient at a wavelength of 450 nm of greater than or equal to 270 $mL \cdot g^{-1} \cdot cm^{-1}$. For example, the quantum dot 100 may have a mass extinction coefficient at a wavelength of 450 nm of greater than or equal to 280 $mL \cdot g^{-1} \cdot cm^{-1}$. For example, the quantum dot 100 may have a mass extinction coefficient at a wavelength of 450 nm of greater than or equal to 290 $mL \cdot g^{-1} \cdot cm^{-1}$. For example, the quantum dot 100 may have a mass extinction coefficient at a wavelength of 450 nm of greater than or equal to 300 $mL \cdot g^{-1} \cdot cm^{-1}$. For example, the quantum dot 100 may have a mass extinction coefficient at a wavelength of 450 nm of greater than or equal to 310 $mL \cdot g^{-1} \cdot cm^{-1}$.

For example, the quantum dot 100 may have a mass extinction coefficient at a wavelength of 450 nm is in a range of about 250 $mL \cdot g^{-1} \cdot cm^{-1}$ to about 450 $mL \cdot g^{-1} \cdot cm^{-1}$. For example, the quantum dot 100 may have a mass extinction coefficient at a wavelength of 450 nm is in a range of about 260 $mL \cdot g^{-1} \cdot cm^{-1}$ to about 450 $mL \cdot g^{-1} \cdot cm^{-1}$. For example, the quantum dot 100 may have a mass extinction coefficient at a wavelength of 450 nm is in a range of about 270 $mL \cdot g^{-1} \cdot cm^{-1}$ to about 450 $mL \cdot g^{-1} \cdot cm^{-1}$. For example, the quantum dot 100 may have a mass extinction coefficient at a wavelength of 450 nm is in a range of about 280 $mL \cdot g^{-1} \cdot cm^{-1}$ to about 450 $mL \cdot g^{-1} \cdot cm^{-1}$. For example, the quantum dot 100 may have a mass extinction coefficient at a wavelength of 450 nm is in a range of about 290 $mL \cdot g^{-1} \cdot cm^{-1}$ to about 450 $mL \cdot g^{-1} \cdot cm^{-1}$. For example, the quantum dot 100 may have a mass extinction coefficient at a wavelength of 450 nm is in a range of about 300 $mL \cdot g^{-1} \cdot cm^{-1}$ to about 450 $mL \cdot g^{-1} \cdot cm^{-1}$. For example, the quantum dot 100 may have a mass extinction coefficient at a wavelength of 450 nm is in a range of about 310 $mL \cdot g^{-1} \cdot cm^{-1}$ to about 450 $mL \cdot g^{-1} \cdot cm^{-1}$.

In an embodiment, the quantum dot 100 may have a maximum emission wavelength of a photoluminescence (PL) spectrum in a range of about 500 nm to about 540 nm. For example, the quantum dot 100 may have a maximum emission wavelength of a PL spectrum in a range of about 505 nm to about 535 nm. For example, the quantum dot 100 may have a maximum emission wavelength of a PL spectrum in a range of about 510 nm to about 530 nm. For example, the quantum dot 100 may emit green light.

In an embodiment, the quantum dot 100 may have a photoluminescence quantum yield (PLQY) of greater than or equal to 80%. For example, the quantum dot 100 may have a PLQY of greater than or equal to 85%. For example, the quantum dot 100 may have a PLQY of greater than or equal to 90%.

In an embodiment, the PLQY of a solution after purifying the quantum dot 100 in a solvent may be greater than or equal to 90%, compared to the initial PLQY. For example, the PLQY of a solution after purifying the quantum dot 100 in a solvent may be greater than or equal to 93%, compared to the initial PLQY. For example, the solvent of the solution may be ethanol (EtOH).

In an embodiment, the quantum dot 100 may be a crystal of a semiconductor compound, and may include any material capable of emitting light of various emission wavelengths according to a size of the crystal.

In an embodiment, the quantum dot 100 may have a diameter in a range of, for example, about 1 nm to about 10 nm.

In an embodiment, the quantum dot 100 may be synthesized by a wet chemical process, an organic metal chemical vapor deposition process, a molecular beam epitaxy process, or any process similar thereto.

The wet chemical process is a method including mixing a precursor material with an organic solvent and growing quantum dot particle crystals. When the crystal grows, the organic solvent naturally acts as a dispersant coordinated on the surface of the quantum dot crystal and controls the growth of the crystal so that the growth of quantum dot particles may be controlled through a process which costs less, and may be more readily performed than vapor deposition methods, such as metal organic chemical vapor deposition (MOCVD) or molecular beam epitaxy (MBE).

The quantum dot 100 may further include a Group II-VI semiconductor compound, a Group III-V semiconductor compound, a Group III-VI semiconductor compound, a Group semiconductor compound, a Group IV-VI semiconductor compound, a Group IV element or compound, or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the Group III-V semiconductor compound may include: a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. In an embodiment, the Group III-V semiconductor compound may further include a Group II element. Examples of the Group III-V semiconductor compound further including the Group II element may include InZnP, InGaZnP, InAlZnP, and the like.

Examples of the Group III-VI semiconductor compound may include a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof.

Examples of the Group semiconductor compound may include: a ternary compound, such as AgInS, $AgInS_2$, CuInS, $CuInS_2$, $CuGaO_2$, $AgGaO_2$, $AgAlO_2$, and the like; or any combination thereof.

Examples of the Group IV-VI semiconductor compound may include: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

Examples of the Group IV element or compound may include: a single element material, such as Si, Ge, and the like; a binary compound, such as SiC, SiGe, and the like; or any combination thereof.

Each element included in a multi-element compound, such as a binary compound, a ternary compound, and a quaternary compound, may be present at a uniform concentration or at a non-uniform concentration in a particle.

In an embodiment, the quantum dot 100 may have a single structure in which the concentration of each element in the quantum dot is uniform, or may have a core-shell structure. For example, in case that the quantum dot has a core-shell structure, a material included in the core and a material included in the shell may be different from each other.

The shell 20 of the quantum dot may serve as a protective layer which prevents chemical denaturation of the core to maintain semiconductor characteristics, and/or may serve as a charging layer which imparts electrophoretic characteristics to the quantum dot. The shell 20 may be single-layered or multi-layered. The interface between the core 10 and the shell 20 may have a concentration gradient in which the concentration of an element in the shell decreases toward the core 10.

Examples of the shell 20 of the quantum dot 100 may include a metal oxide, a metalloid oxide, a non-metal oxide, a semiconductor compound, or a combination thereof. Examples of the metal oxide, the metalloid oxide, and the non-metal oxide include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound, such as $MgAl_2O_4$, $CoFe_2O_4$, $NiFe_2O_4$, $CoMn_2O_4$, and the like; or any combination thereof. Examples of the semiconductor compound may include, as described herein: a Group II-VI semiconductor compound; a Group III-V semiconductor compound; a Group III-VI semiconductor compound; a Group I-III-VI semiconductor compound; a Group IV-VI semiconductor compound; or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

In an embodiment, a full width at half maximum (FWHM) of an emission wavelength spectrum of the quantum dot 100 may be less than or equal to about 45 nm. For example, the FWHM of an emission wavelength spectrum of the quantum dot may be less than or equal to about 40 nm. For example, the FWHM of an emission wavelength spectrum of the quantum dot may be less than or equal to about 30 nm. Within these ranges, the quantum dot 100 may have improved color purity or may have improved color reproducibility. Light emitted through the quantum dot 100 may be emitted in all directions, so that a wide viewing angle of the quantum dot 100 may be improved.

The quantum dot 100 may be in the form of spherical, pyramidal, multi-arm, or cubic nanoparticles, nanotubes, nanowires, nanofibers, or nanoplate particles.

The energy band gap may be adjusted by controlling the size of the quantum dot 100, and thus light having various wavelength bands may be obtained from a quantum dot-containing emission layer. Accordingly, by using quantum dots 100 of different sizes, a light-emitting device that emits light of various wavelengths may be implemented. In an embodiment, the size of the quantum dots 100 may be selected to emit red, green, and/or blue light. The size of the quantum dots 100 may be configured to emit white light by combination of light of various colors.

[Method of Preparing Quantum Dot 100]

Another aspect of the disclosure provides a method of preparing the quantum dot 100, which may include:

- preparing a first composition including a first precursor including a first element, a second precursor including a second element, a third precursor including a third element, a fatty acid, and a solvent;
- preparing a second composition including a fourth precursor including a fourth element,
- preparing a first mixture by mixing the first composition with the second composition; and
- preparing a core by heating the first mixture.

In an embodiment, the first element and the second element may each independently include a Group III element, and the first element and the second element may be different from each other,

- the third element may be a Group II element,
- the fourth element may be a Group V element,
- the number of carbon atoms in the fatty acid may be in a range of 2 to 15,
- the quantum dot includes the core which may include the first element, the second element, and the fourth element,
- the number of moles of the first element may be $n^1$,
- the number of moles of the second element may be $n^2$,
- the number of moles of the fourth element may be $n^4$, and
- a ratio of a sum of the number of moles of the first element and the number of moles of the second element to the number of moles of the fourth element in the core $((n^1+n^2)n^4)$ may be in a range of about 1.0 to about 2.0.

In the preparation of the core including the first element, the second element, and the fourth element (for example, a core including In, Ga, and P), when a percentage of the fourth element in the first mixture is small, an element having a superior binding to the fourth element in terms of reaction kinetics among the first element and the second element exists. Accordingly, such a superior element, for example, an element having strong binding between the first element and the fourth element, may be formed, and the second element may be located on the surface of the core 10 in a form other than the binding form with the fourth element.

In the preparation of the quantum dot 100, an exchange between the second element and the third element may occur by the third precursor including the third element (e.g., Zn), thereby losing the second element.

As described above, when the core 10 in which a ratio of the sum of the number of moles of the first element and the number of moles of the second element to the number of moles of the fourth element ($(n^1+n^2)/n^4$) is in a range of about 1.0 to about 2.0 is used, the loss of the first element or the second element during the method of preparing the quantum dot 100, for example, the preparing of the shell 20, may be prevented.

However, in the preparation of the core 10 in which a ratio of the sum of the number of moles of the first element and the number of moles of the second element to the number of moles of the fourth element ($(n^1+n^2)/n^4$) is in a range of about 1.0 to about 2.0, as the number of moles of the fourth element, which serves as an anion source, increases, the number of cores 10 to be generated increases, but the size of the core 10 decreases.

Therefore, by introducing a short fatty acid in which the number of carbon atoms is in a range of 2 to 15 in the first mixture, the steric hindrance of the fatty acid which serves as a ligand may be reduced, thereby increasing the size of the core 10 of the quantum dot 100. Accordingly, the size of the core 10 prepared by the method of preparing the quantum dot 100 may be maintained while having a high content of the fourth element, and thus, as the total cross-sectional size of the core 10 may be also maintained, thereby preventing the deterioration in stability caused by an increase in defect sites on the surface of the quantum dot 100.

In an embodiment, after the preparing of the core 10, the method may further include preparing the shell 20 that covers at least a portion of the core 10.

In an embodiment, after the preparing of the first composition, the method may further include: raising a temperature of the first composition to a range of about 110° C. to about 130° C.; and maintaining the raised temperature.

In an embodiment, after the maintaining of the temperature of the first composition raised to a range of about 110° C. to about 130° C., the method may further include vacuum-treating the first composition.

In an embodiment, a ratio of the number of moles of the fourth element to the sum of the number of moles of the first element and the number of moles of the second element in the first mixture ($n'^4/(n'^1+n'^2)$) may be in a range of about 0.5 to about 0.9.

In the preparation of the core 10, when the first precursor, the second precursor, and the third precursor are used so that the ratio of the number of moles of the fourth element to the sum of the number of moles of the first element and the number of moles of the second element in the first mixture ($n'^4/(n'^1+n'^2)$) is in a range of about 0.5 to about 0.9, the core 10 in which the ratio of the sum of the number of moles of the first element and the number of moles of the second element relative to the number of moles of the fourth element ($(n^1+n^2))/n^4$) is in a range of about 1.0 to about 2.0 and the first exciton peak of the UV-Vis spectrum is formed within an ideal range may be prepared.

In an embodiment, a first exciton peak of the UV-Vis spectrum of the core 10 may have a wavelength in a range of about 350 nm to about 450 nm.

In an embodiment, the first element and the second element may each independently include scandium (Sc), aluminum (Al), gallium (Ga), indium (In), thallium (Tl), or any combination thereof.

In an embodiment, the binding force of the first element with the fourth element may be greater than or equal to the binding force of the second element with the fourth element.

For example, the first element may be In, and the second element may be Ga, but embodiments of the disclosure are not limited thereto.

In an embodiment, the third element may include beryllium (Be), magnesium (Mg), calcium (Ca), strontium (Sr), barium (Ba), zinc (Zn), cadmium (Cd), mercury (Hg), or any combination thereof.

For example, the third element may be Zn, but embodiments of the disclosure are not limited thereto.

In an embodiment, the fourth element may include vanadium (V), niobium (Nb), nitrogen (N), phosphorus (P), arsenic (As), antimony (Sb), or any combination thereof.

For example, the fourth element may be P, but embodiments of the disclosure are not limited thereto.

In an embodiment, the number of carbon atoms in the fatty acid may be in a range of 6 to 12.

In an embodiment, the fatty acid may include caprylic acid, capric acid, or lauric acid.

In an embodiment, the solvent may include an aromatic solvent, an aliphatic solvent, a fluorine-based solvent, or any combination thereof.

In an embodiment, the number of moles of the third element may be $n^3$, and a ratio of the number of moles of the third element to the number of moles of the first element in the first mixture ($n^3/n^1$) may be greater than 0 and less than or equal to 2.0.

In an embodiment, a ratio of the number of moles of the second element to the number of moles of the first element in the first mixture ($n^2/n^1$) may be greater than or equal to 0.05 and less than or equal to 5.

In an embodiment, the core 10 prepared by the preparing of the core may be represented by Formula 1:

$$M^1_xM^2_{1-x}M^4_y \quad \text{[Formula 1]}$$

In Formula 1, $M^1$ may be the first element, $M^2$ may be the second element, $M^4$ may be the fourth element, x may be a real number greater than 0 and less than 1, and y may be a real number greater than 0 and less than or equal to 1, and may satisfy $1.0 \le 1/y < 2.0$.

In an embodiment, y may satisfy $1.0 < 1/y < 2.0$.

In an embodiment, the core 10 prepared by the preparing of the core may be represented by Formula 2:

$$In_xGa_{1-x}P_y \quad \text{[Formula 2]}$$

In Formula 2, x may be a real number greater than 0 and less than 1, and y may be a real number greater than 0 and less than or equal to 1, and may satisfy $1.0 \le 1/y < 2.0$.

In an embodiment, the core 10 may have a diameter in a range of about 1.5 nm to about 3.0 nm. For example, the core 10 may have a diameter in a range of about 1.5 nm to about 2.5 nm. For example, the core 10 may have a diameter in a range of about 1.6 nm to about 2.4 nm. For example, the core 10 may have a diameter in a range of about 1.7 nm to about 2.3 nm. For example, the core 10 may have a diameter in a range of about 1.8 nm to about 2.2 nm.

In an embodiment, the heating of the first mixture in the preparation of the core 10 may include: raising the temperature from room temperature to a temperature in a range of about 250° C. to about 350° C.; and maintaining the raised temperature.

The term "reaction time of the first mixture" as used in the specification may be the time required to raise the temperature from room temperature to a given temperature, the time to maintain the raised temperature, or the sum thereof.

[Optical Member]

The quantum dot 100 may be used in various optical members. Accordingly, an optical member including the quantum dot 100 may be provided.

In an embodiment, the optical member may be a light control means.

In embodiments, the optical member may be a color filter, a color conversion member, a capping layer, a light-extraction efficiency enhancement layer, a selective light-absorption layer, or a polarizing layer.

[Electronic Apparatus]

The quantum dot 100 may be used in various electronic apparatuses. Accordingly, an electronic apparatus including the quantum dot 100 may be provided.

In an embodiment, an electronic apparatus may further include: a light source; and a color conversion member arranged in an optical path of light emitted from the light source, wherein the color conversion member includes the quantum dot.

Figure 3:
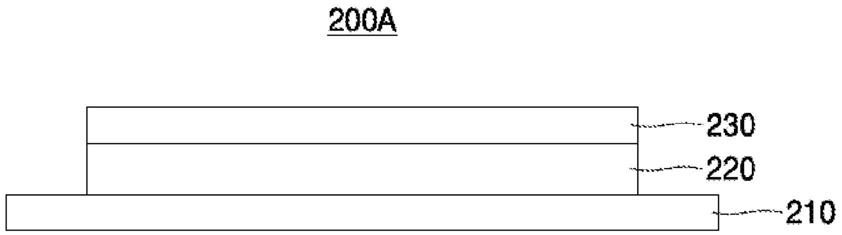
FIG. 3 is a schematic cross-sectional view of an electronic apparatus according to an embodiment.

FIG. 3 is a schematic cross-sectional view of an electronic apparatus 200A according to an embodiment. The electronic apparatus 200A of FIG. 3 includes: a substrate 210; a light source 220 on the substrate 210; and a color conversion member 230 on the light source 220.

For example, the light source 220 may be a backlight unit (BLU) for use in liquid crystal displays (LCDs), a fluorescent lamp, a light-emitting device, an organic light-emitting device, a quantum-dot light-emitting device (QLED), or any combination thereof. The color conversion member 230 may be arranged in at least one direction of travel of light emitted from the light source 220.

At least a region of the color conversion member 230 of the electronic apparatus 200A may include the quantum dot 100, and the region may absorb light emitted from the light source 220 to emit green light having a maximum emission wavelength in a range of about 500 nm to about 540 nm.

In an embodiment, the color conversion member 230 may be arranged in at least one direction of travel of the light emitted from the light source 220 and may not exclude other elements from being further included between the color conversion member 230 and the light source 220.

In an embodiment, between the light source 220 and the color conversion member 230, a polarizing plate, a liquid crystal layer, a light guide plate, a diffusion plate, a prism sheet, a microlens sheet, a luminance enhancing sheet, a reflective film, a color filter, or any combination thereof may be further included.

In embodiments, a polarizing plate, a liquid crystal layer, a light guide plate, a diffusion plate, a prism sheet, a microlens sheet, a luminance enhancing sheet, a reflective film, a color filter, or any combination thereof may be further included on the color conversion member 230.

The electronic apparatus 200A of FIG. 3, which is an embodiment according to the disclosure, may have any of various shapes, and accordingly, may further include various structures.

In embodiments, an electronic apparatus may include a structure including a light source, a light guide plate, a color conversion member, a first polarizing plate, a liquid crystal layer, a color filter, and a second polarizing plate which may be in this stated order.

In embodiments, an electronic apparatus may include a structure including a light source, a light guide plate, a first polarizing plate, a liquid crystal layer, a second polarizing plate, and a color conversion member which may be in this stated order.

In the embodiments described above, the color filter may include a pigment or a dye. In the embodiments described above, one of the first polarizing plate and the second polarizing plate may be a vertical polarizing plate, and the other one may be a horizontal polarizing plate.

Here, the quantum dot as described herein may be used as an emitter. Accordingly, in embodiments, an electronic apparatus may include a light-emitting device that includes: a first electrode; a second electrode facing the first electrode; and an emission layer between the first electrode and the second electrode may be provided, wherein the light-emitting device (for example, the emission layer of the light-emitting device) may include the quantum dot. The light-emitting device may further include a hole transport region between the first electrode and the emission layer, an electron transport region between the emission layer and the second electrode, or a combination thereof.

Figure 4:
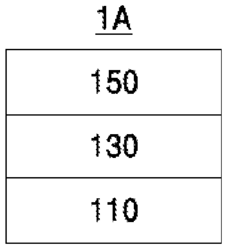
FIG. 4 is a schematic cross-sectional view of a light-emitting device according to an embodiment.

FIG. 4 is a schematic cross-sectional view of a light-emitting device 1A according to an embodiment of the disclosure. The light-emitting device 1A includes a first electrode 110, an interlayer 130, and a second electrode 150.

Hereinafter, a structure of the light-emitting device 1A according to an embodiment and a method of manufacturing the light-emitting device 1A are described in connection with FIG. 4.

[First Electrode 110]

A substrate may be further included under the first electrode 110 or on the second electrode 150 of FIG. 4. In an embodiment, the substrate may be a glass substrate or a plastic substrate. In embodiments, the substrate may be a flexible substrate, and for example, may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layered structure of ITO/Ag/ITO.

[Interlayer 130]

The interlayer 130 may be on the first electrode 110. The interlayer 130 may include an emission layer.

The interlayer 130 may further include a hole transport region between the first electrode 110 and the emission layer, and an electron transport region between the emission layer and the second electrode 150.

In an embodiment, the interlayer 130 may further include, in addition to various organic materials, a metal-containing compound, such as an organometallic compound, an inorganic material, such as a quantum dot, and the like.

In embodiments, the interlayer 130 may include two or more emitting units stacked between the first electrode 110 and the second electrode 150 and at least one charge generation layer between the two or more emitting units. When the interlayer 130 includes the two or more emitting units and the at least one charge generation layer, the light-emitting device 1A may be a tandem light-emitting device.

[Hole Transport Region in Interlayer 130]

The hole transport region may have: a structure consisting of a layer consisting of a single material, a structure consisting of a layer including multiple materials that are different from each other, or a structure including multiple layers including different materials.

The hole transport region may include a hole injection layer, a hole transport layer, an emission auxiliary layer, an electron blocking layer, or any combination thereof.

In embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituent layers of each structure may be stacked from the first electrode 110 in this respective stated order, but the structure of the hole transport region is not limited to.

The hole transport region may include a compound represented by Formula 201, a compound represented by Formula 202, or any combination thereof:

[Formula 201]

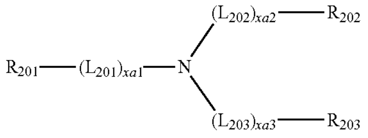

[Formula 202]

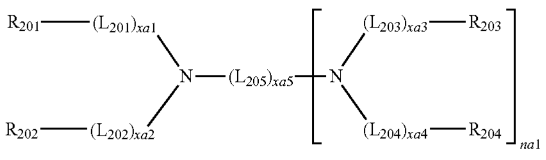

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may each independently include at least one of groups represented by Formulae CY201 to CY217:

CY201

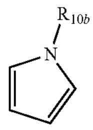

CY202

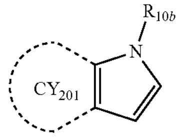

CY203

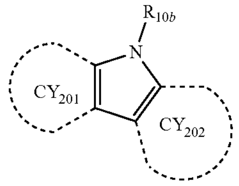

CY204

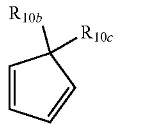

CY205

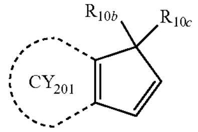

CY206

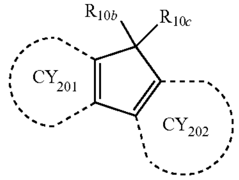

-continued

CY207

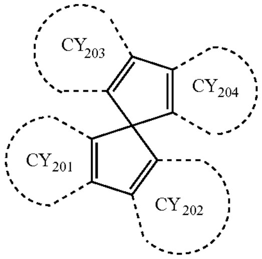

CY208

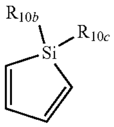

CY209

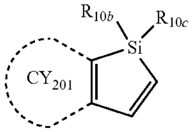

CY210

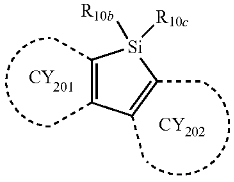

CY211

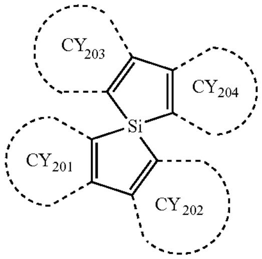

CY212

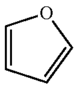

CY213

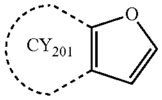

CY214

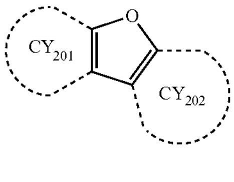

-continued

CY215

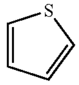

CY216

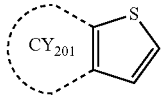

CY217

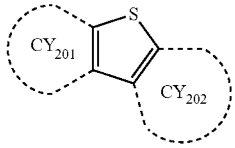

In Formulae CY201 to CY217, $R_{10b}$ and $R_{10c}$ may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring CY201 to ring CY204 may each independently be a benzene group, a naphthalene group, a phenanthrene group, or an anthracene group.

In embodiments, Formulae 201 and 202 may each independently include at least one of the groups represented by Formulae CY201 to CY203.

In embodiments, a compound represented by Formula 201 may include at least one of the groups represented by Formulae CY201 to CY203 and at least one of the groups represented by Formulae CY204 to CY217.

In embodiments, in Formula 201, xa1 may be 1, $R_{201}$ may be one of the groups represented by Formulae CY201 to CY203, xa2 may be 0, and $R_{202}$ may be one of the groups represented by Formulae CY204 to CY207.

In embodiments, Formulae 201 and 202 may each not include the groups represented by Formulae CY201 to CY203.

In embodiments, Formulae 201 and 202 may each not include the groups represented by Formulae CY201 to CY203, and may each independently include at least one of the groups represented by Formulae CY204 to CY217.

In embodiments, Formulae 201 and 202 may each not include the groups represented by Formulae CY201 to CY217.

For example, the hole transport region may include one of Compounds HT1 to HT46, m-MTDATA, TDATA, 2-TNATA, NPB(NPD), p-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
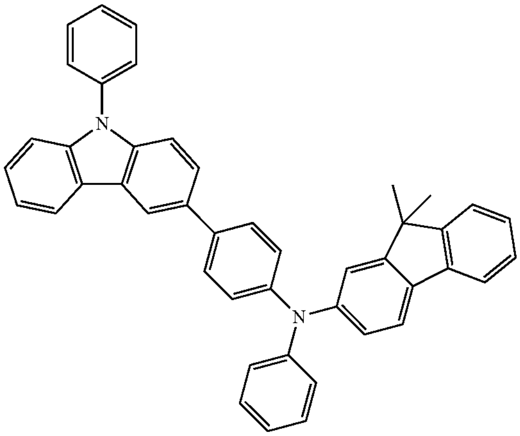
HT2
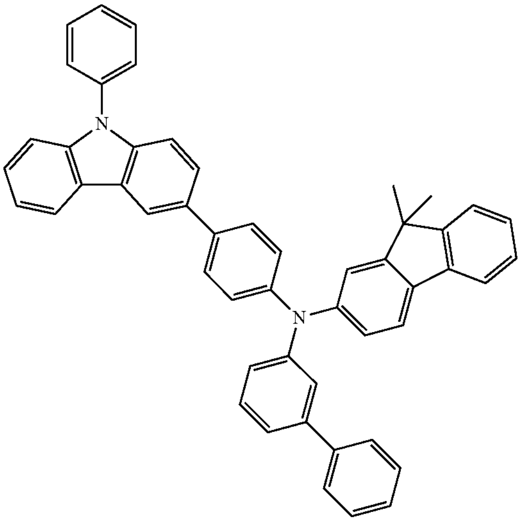
HT3
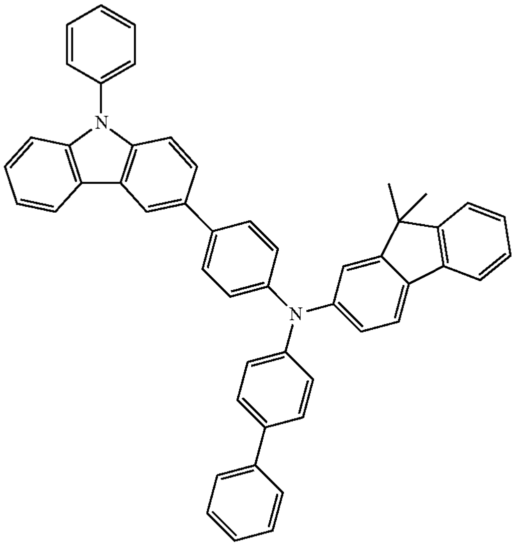
HT4
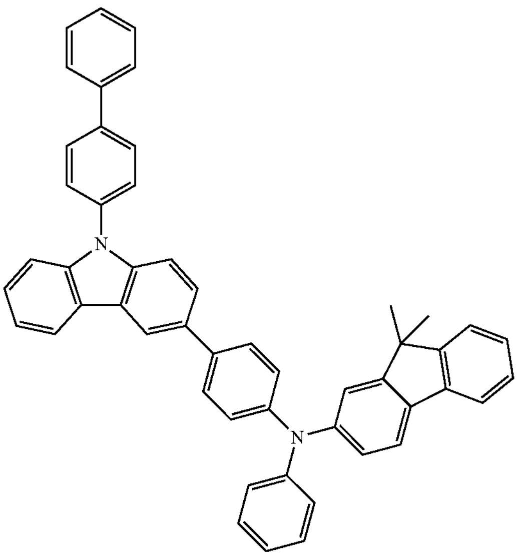
HT5
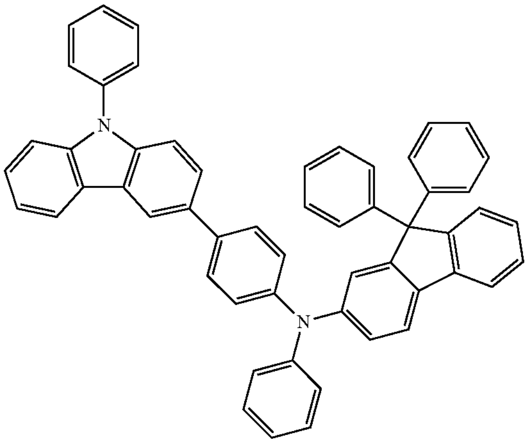
HT6
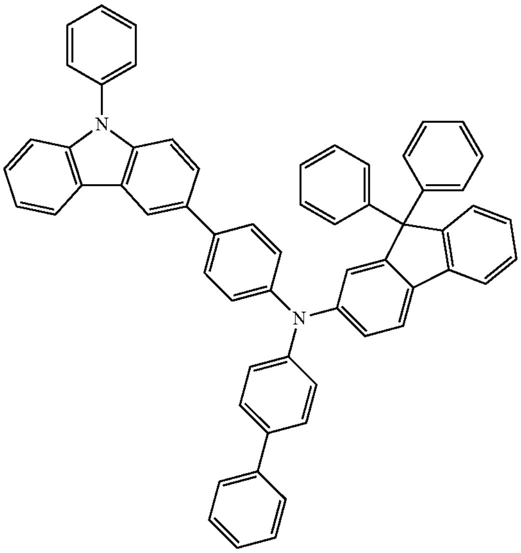

-continued
HT7
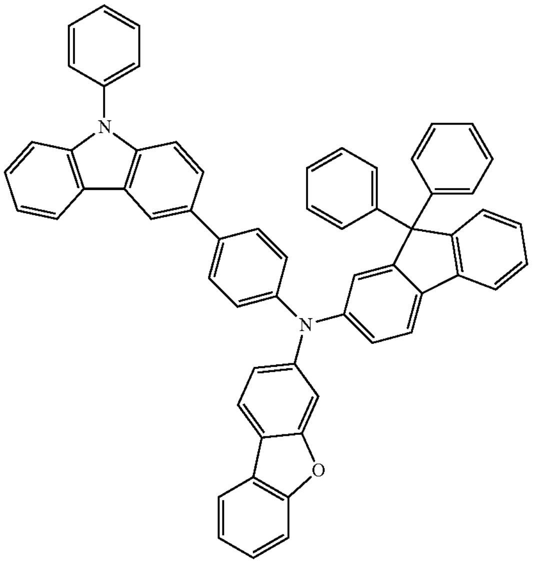
HT8
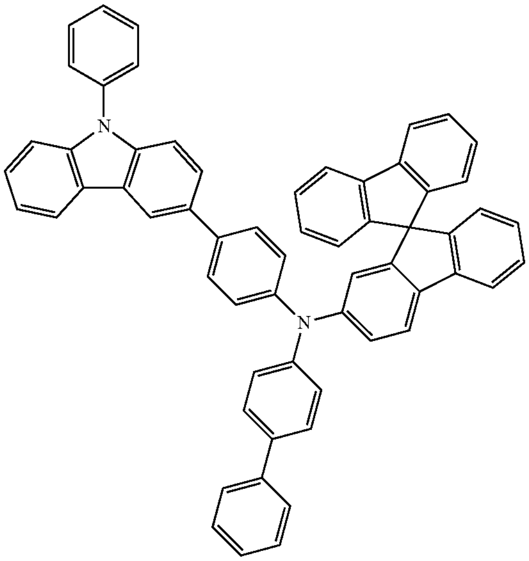
HT9
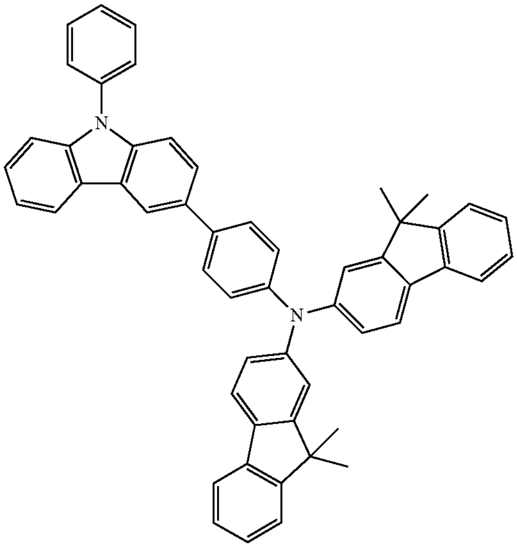
HT10
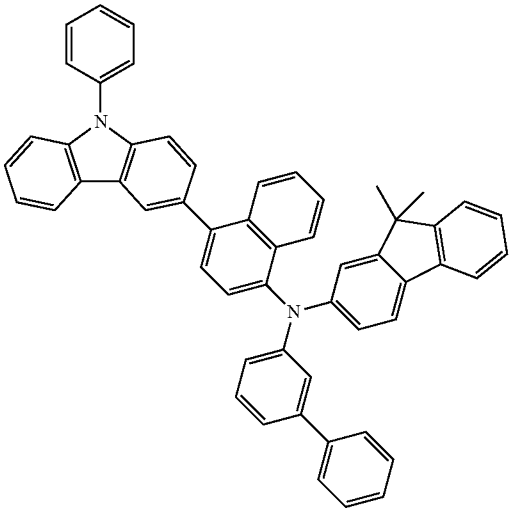
HT11
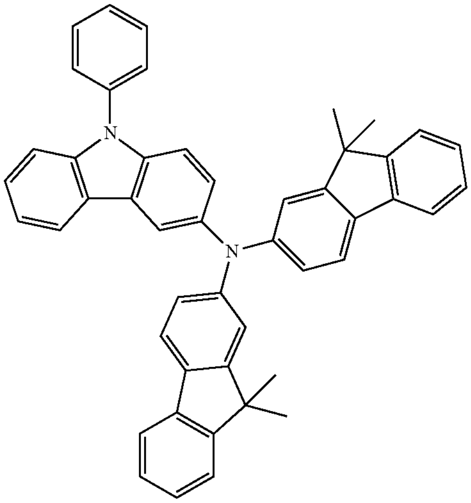
HT12
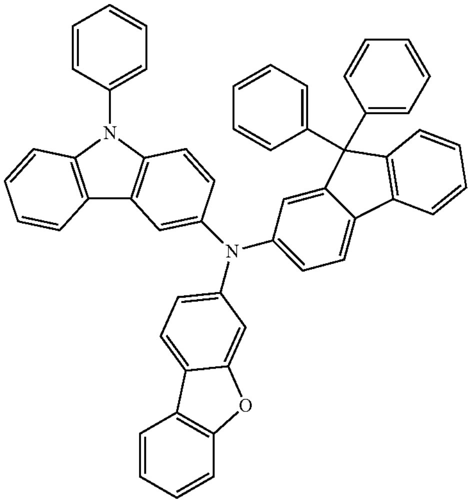

-continued
HT13
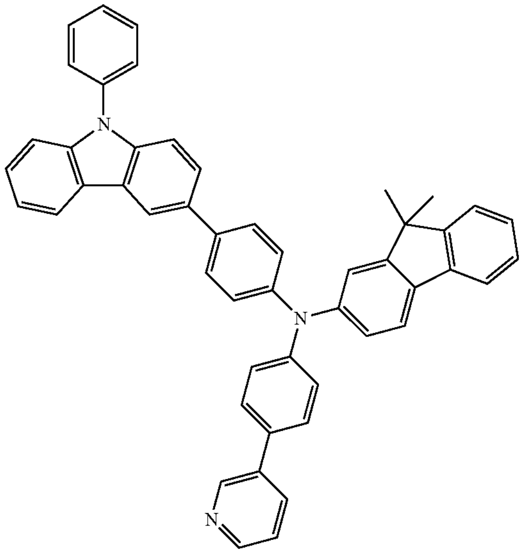
HT14
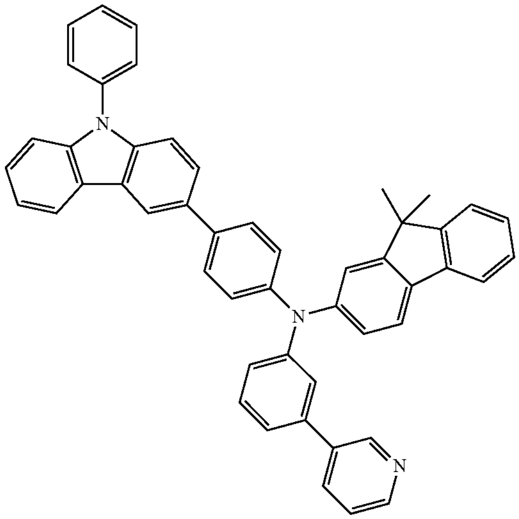
HT15
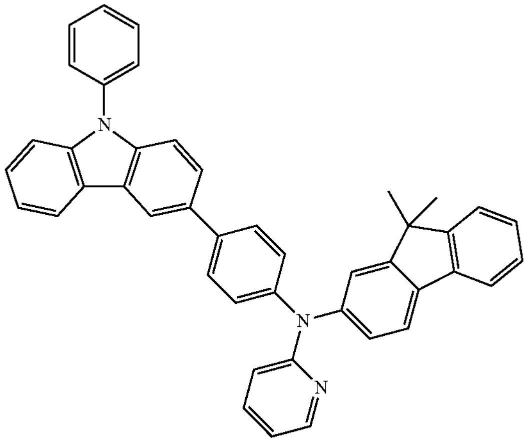
HT16
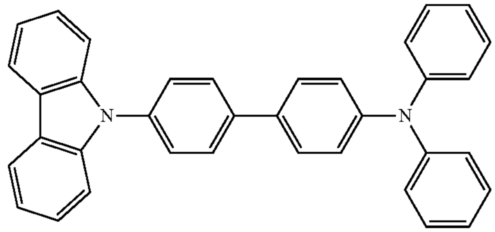
HT17
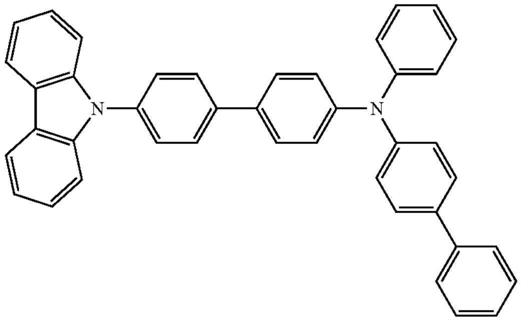
HT18
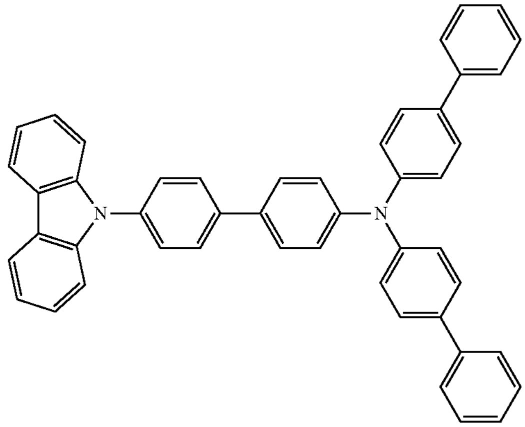

-continued
HT19
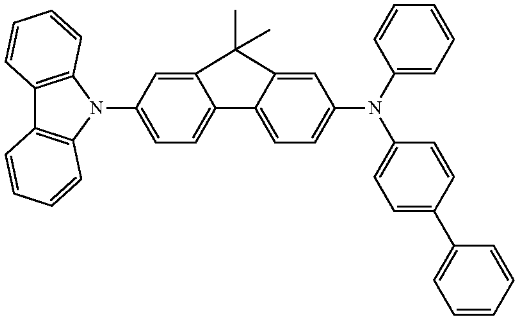
HT20
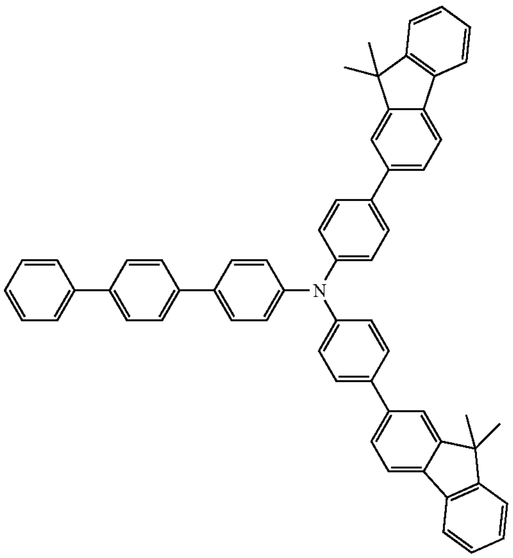
HT21
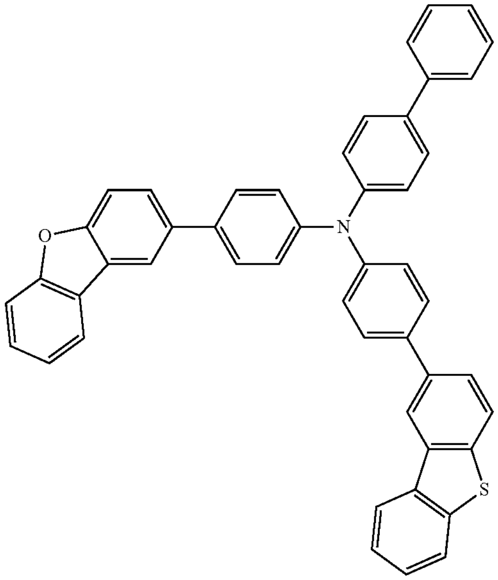
HT22
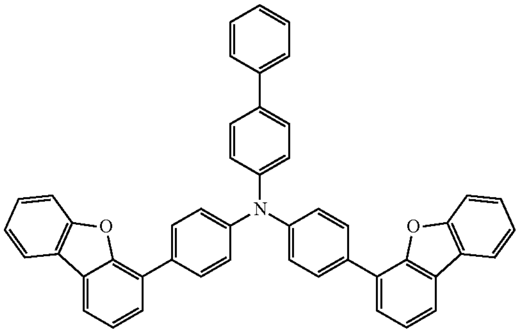
HT23
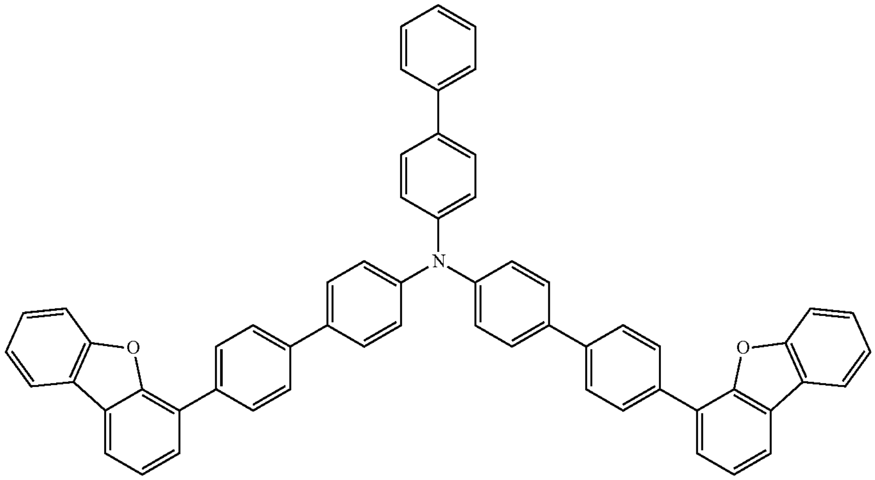

-continued
HT24
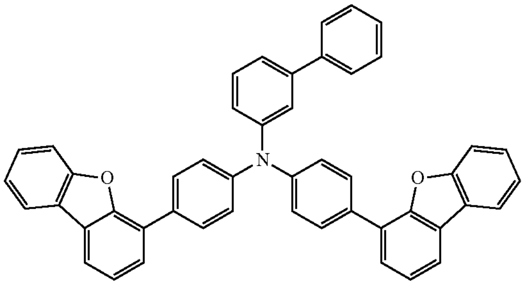
HT25
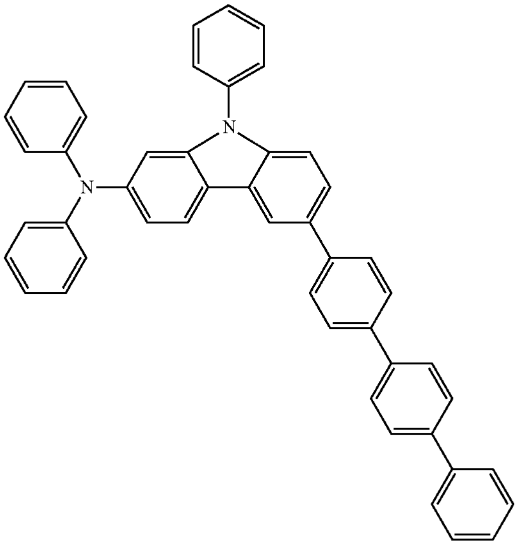
HT26
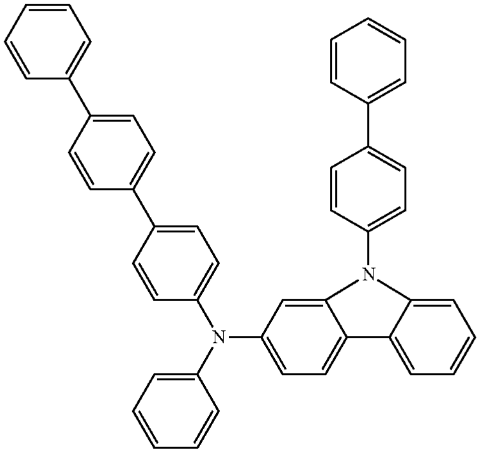
HT27
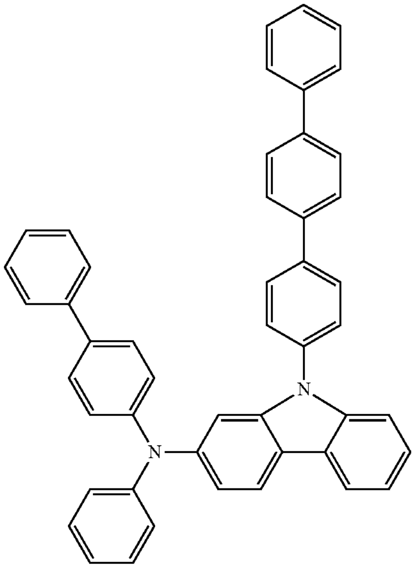
HT28
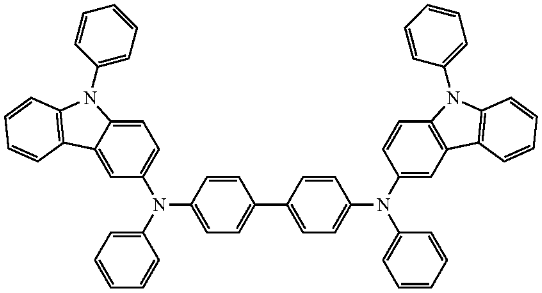
HT29
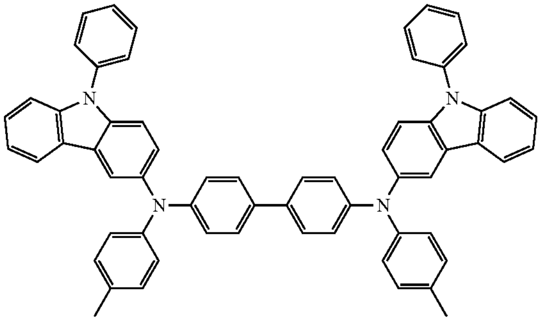

-continued
HT30
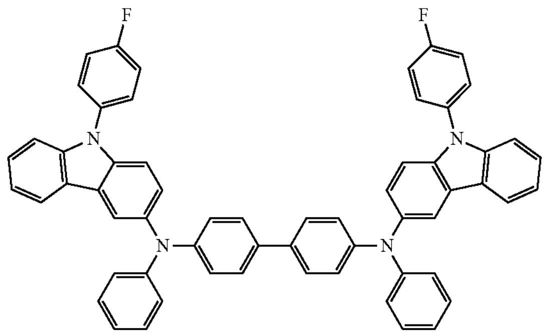
HT31
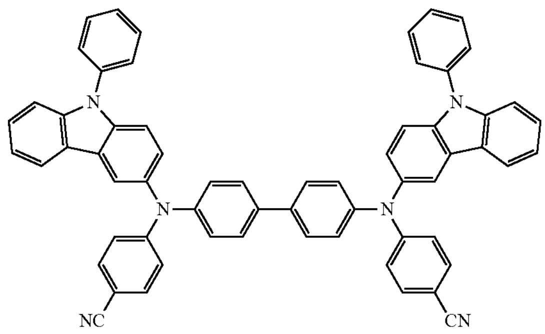
HT32
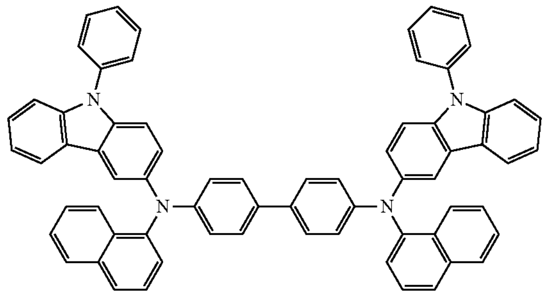
HT33
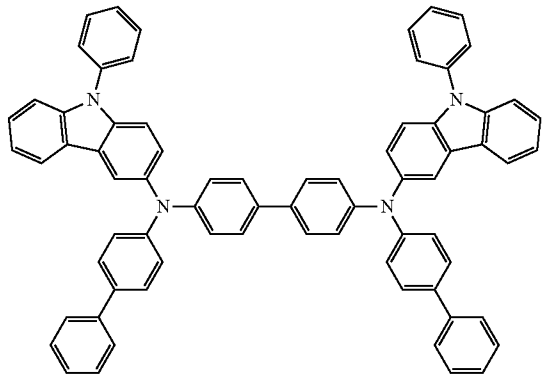
HT34
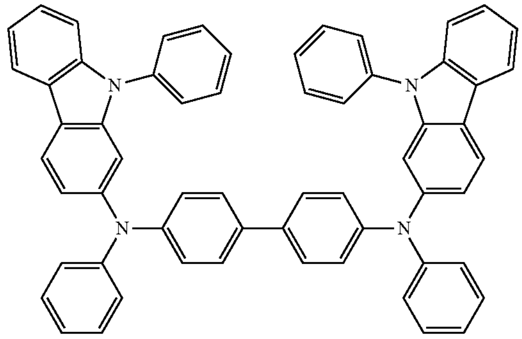
HT35
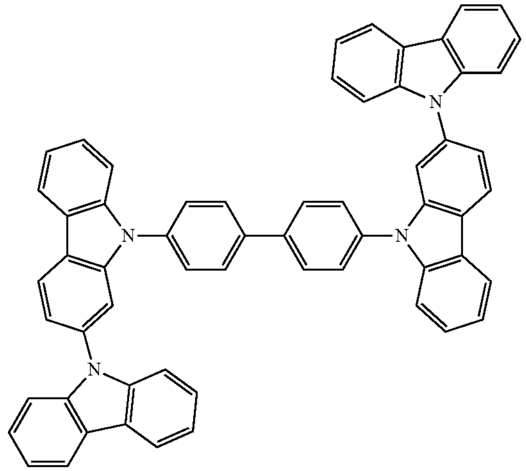

-continued
HT36
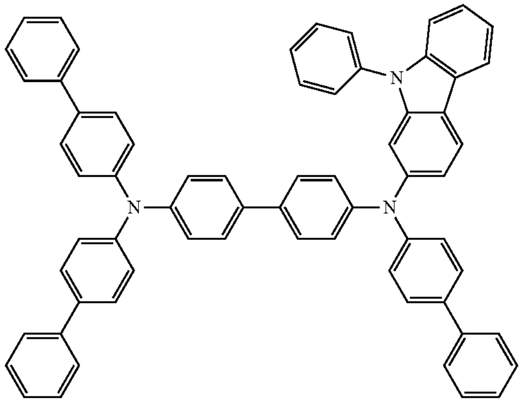
HT37
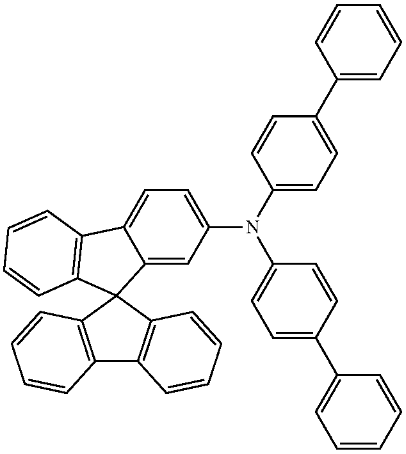
HT38
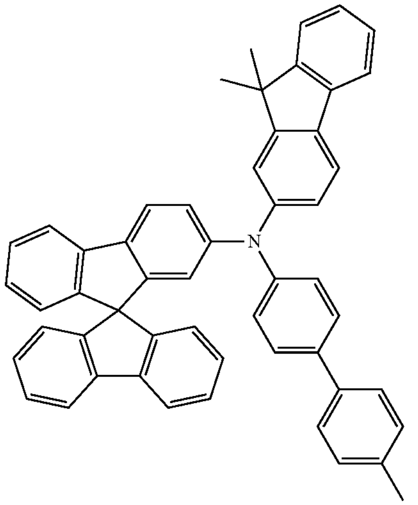
HT39
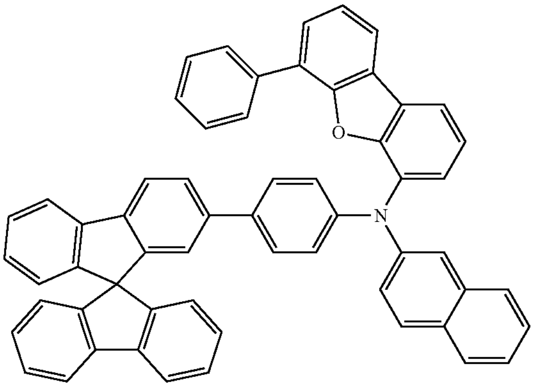
HT40
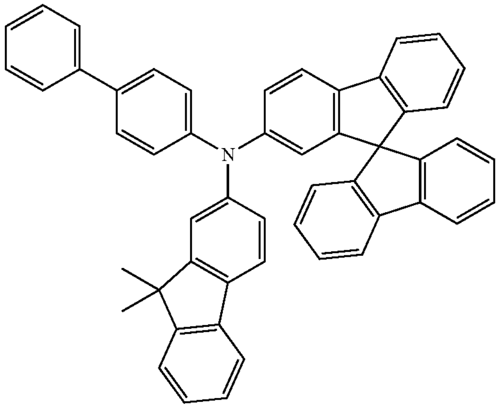
HT41
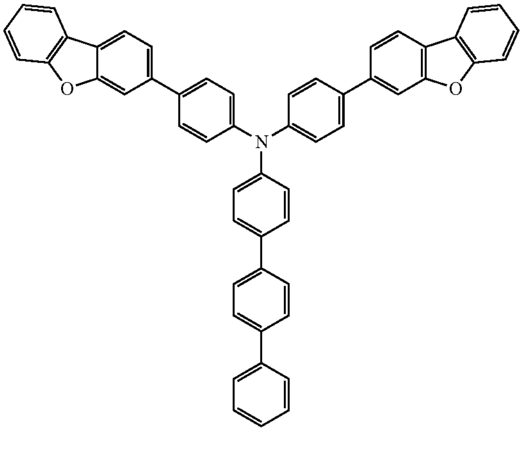

-continued
HT42
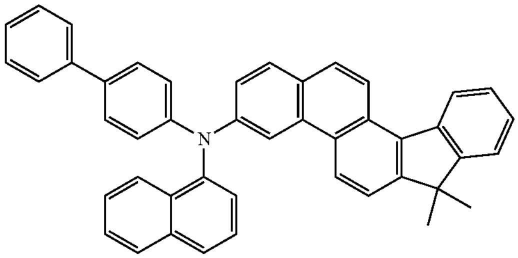
HT43
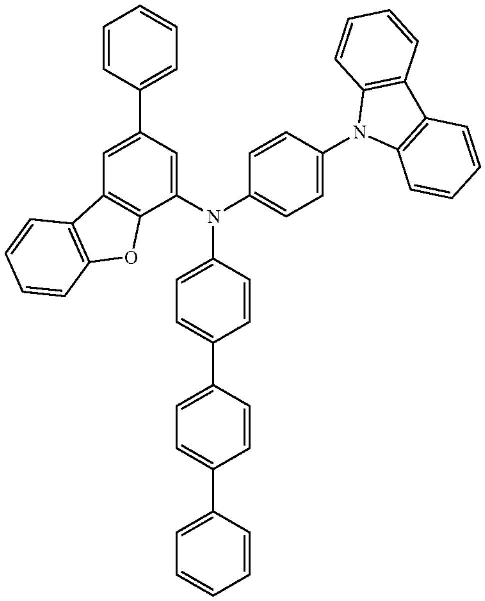
HT44
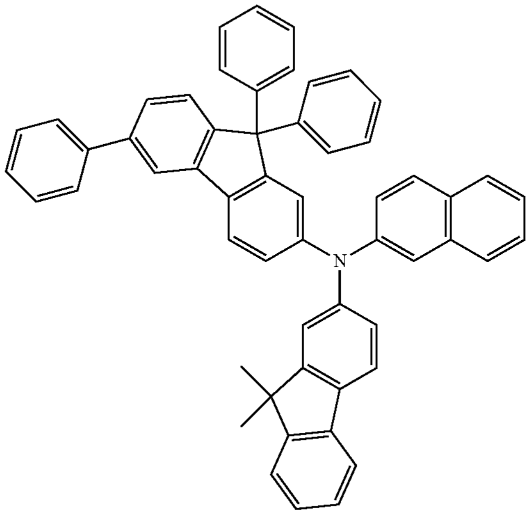
HT45
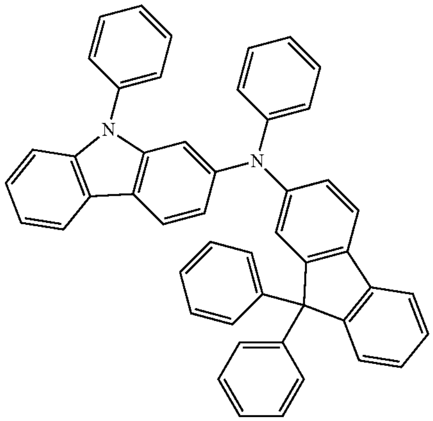
HT46
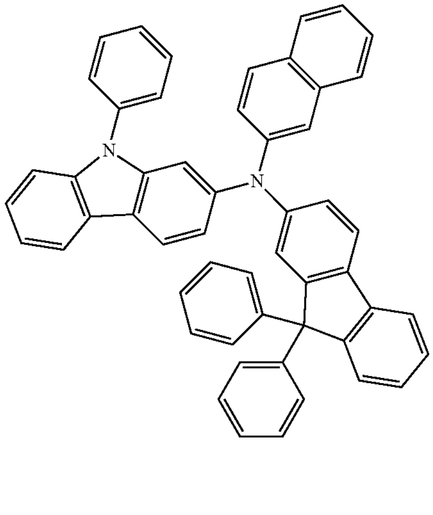

-continued
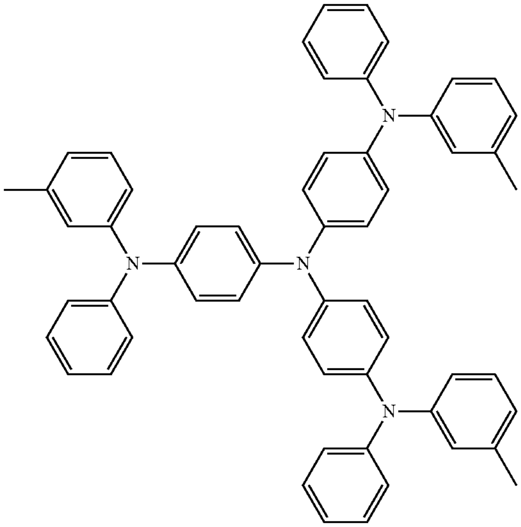
m-MTDATA
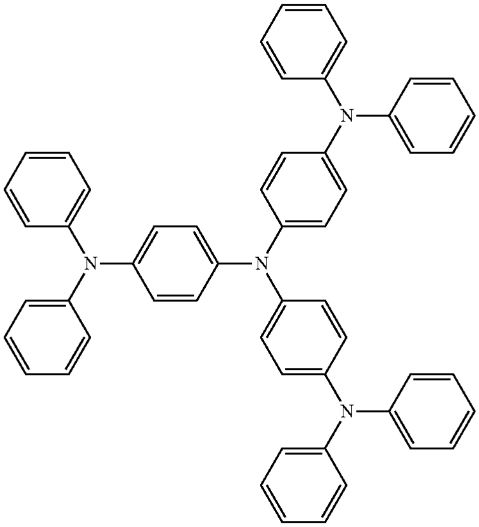
TDATA
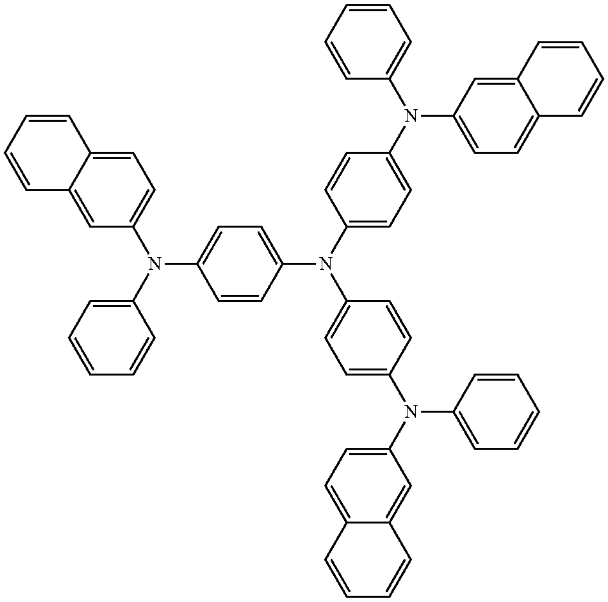
2-TNATA
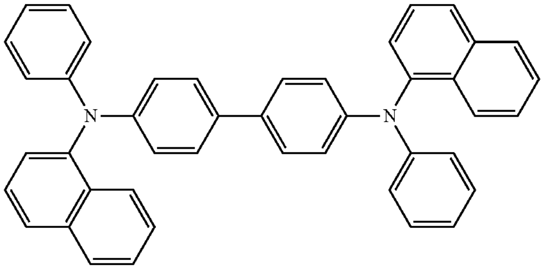
NPB -continued
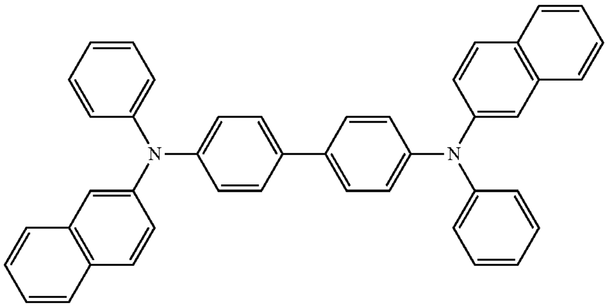
β-NPB
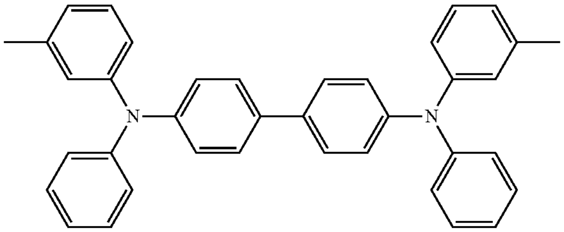
TPD
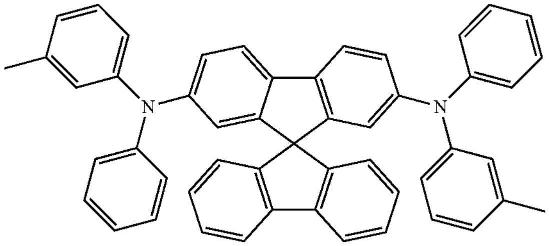
Spiro-TPD
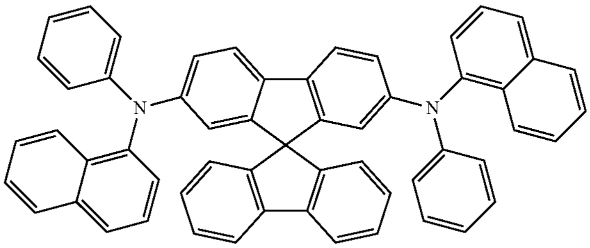
Spiro-NPB
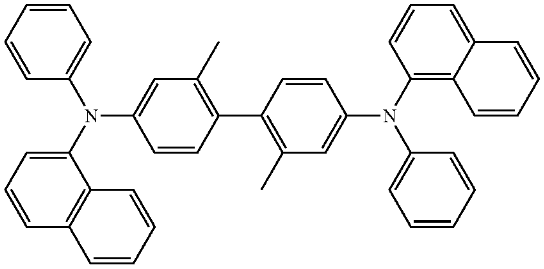
methylated-NPB
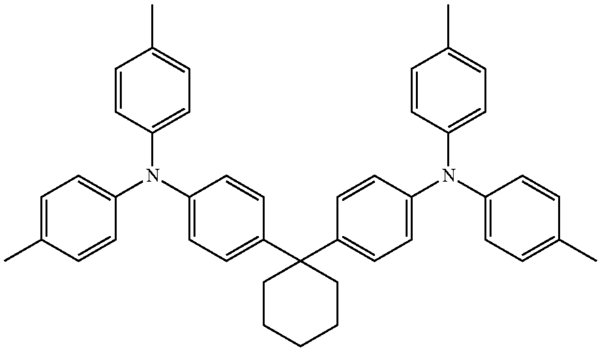
TAPC
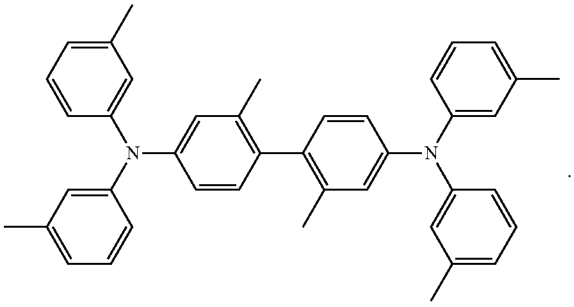
HMTPD A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, the thickness of the hole injection layer may be in a range of about 100 Å to about 9,000 Å, and the thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by the emission layer, and the electron blocking layer may block the leakage of electrons from the emission layer to the hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, the p-dopant may have a lowest unoccupied molecular orbital (LUMO) energy level of equal to or less than about −3.5 eV.

In an embodiment, the p-dopant may include a quinone derivative, a cyano group-containing compound, a compound including element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

[Formula 221]

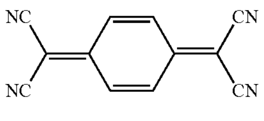

TCNQ

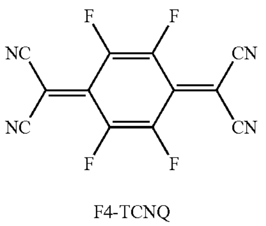

F4-TCNQ

-continued

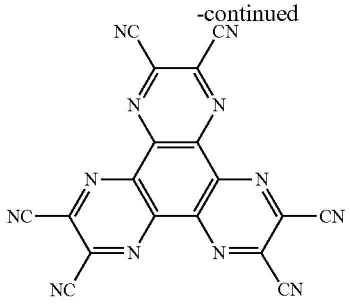

HAT-CN

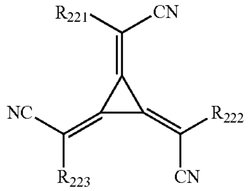

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —CI; —Br; —I; a $C_1$-$C_{20}$ alkyl group substituted with a cyano group, —F, —CI, —Br, —I, or any combination thereof; or any combination thereof.

In the compound including element EL1 and element EL2, element EU may be metal, metalloid, or any combination thereof, and element EL2 may be non-metal, metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and the like.

Examples of the metalloid may include silicon (Si), antimony (Sb), tellurium (Te), and the like.

Examples of the non-metal may include oxygen (O), a halogen (for example, F, Cl, Br, I, etc.), and the like.

Examples of the compound including element EU and element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), rhenium oxide (for example, $ReO_3$, etc.), and the like.

Examples of the metal halide may include an alkali metal halide, an alkaline earth metal halide, a transition metal halide, a post-transition metal halide, a lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $Zri_4$, etc.), a hafnium halide (for example, $HfF_4$, $HfCl_4$, $HfBr_4$, $Hfi_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsC_{12}$, $OsBr_2$, $OSI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $Ir_{12}$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), a gold halide (for example, AuF, AuCl, AuBr, AuI, etc.), and the like.

Examples of the post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and the like.

Examples of the lanthanide metal halide may include YbF, $YbF_2$, $YbF_3$, $SmF_3$, YbCl, $YbCl_2$, $YbCl_3SmCl_3$, YbBr, $YbBr_2$, $YbBr_3SmBr_3$, YbI, $YbI_2$, $YbI_3$, $SmI_3$, and the like.

Examples of the metalloid halide may include an antimony halide (for example, $SbCl_5$, etc.) and the like.

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), a lanthanide metal telluride (for example, LaTe, CeTe, PrTe, NdTe, PmTe, EuTe, GdTe, TbTe, DyTe, HoTe, ErTe, TmTe, YbTe, LuTe, etc.), and the like.

[Emission Layer in Interlayer 130]

The emission layer may be a quantum-dot single layer or have a structure in which two or more quantum-dot layers may be stacked. For example, the emission layer may be a quantum-dot single layer or a structure in which 2 to 100 quantum-dot layers may be stacked.

The emission layer may include the quantum dot as described herein.

In addition to the quantum dot as described herein, the emission layer may further include different quantum dots.

The emission layer may further include, in addition to the quantum dot as described herein, a dispersion medium in which the quantum dots may be dispersed in a naturally coordinated form. The dispersion medium may include an organic solvent, a polymer resin, or any combination thereof. The dispersion medium may be any transparent medium that does not affect the optical performance of the quantum dot, is not deteriorated by light, does not reflect light, or does not absorb light. For example, the solvent may include toluene, chloroform, ethanol, octane, or any combination thereof, and the polymer resin may include epoxy resin, silicone resin, polystyrene resin, acrylate resin, or any combination thereof.

The emission layer may be formed by coating the hole transport region 130 with a quantum dot-containing composition for forming the emission layer and by volatilizing at least a portion of the solvent from the composition for forming the emission layer.

For example, as the solvent, water, hexane, chloroform, toluene, octane, and the like may be used.

The coating of the composition for forming the emission layer may be performed using a spin coat method, a casting method, a micro gravure coating method, a gravure coating method, a bar coating method, a roll coating method, a wire bar coating method, a dip coating method, a spray coating method, a screen printing method, a flexographic method, an offset printing method, an ink jet printing method, and the like.

When the light-emitting device 1A is a full-color light-emitting device, the emission layer may include emission layers that emit light of different colors according to individual subpixels.

In an embodiment, the emission layer may be patterned into a first-color emission layer, a second-color emission layer, and a third-color emission layer according to individual subpixels. Here, at least one emission layer of these emission layers may include the quantum dot. The first-color emission layer may be a quantum dot-emission layer including the quantum dot, and the second-color emission layer and the third-color emission layer may be organic emission layers including organic compounds, respectively. Here, the first color through the third color may be different colors from each other, and for example, the first color through the third color may have different maximum emission wavelengths. The first color through the third color may be white when combined with each other.

In embodiments, the emission layer may further include a fourth-color emission layer, and at least one of the first-color emission layer to the fourth-color emission layers may be a quantum dot-emission layer including the quantum dot, and the remaining emission layers may be organic emission layers including organic compounds, respectively. As such, other various modifications may be possible. Here, the first color through the fourth color may be different colors from each other, and for example, the first color through the fourth color may have different maximum emission wavelengths. The first color through the fourth color may be white when combined with each other.

In an embodiment, the light-emitting device 1A may have a structure in which two or more emission layers emitting light of the same or different colors are stacked to contact each other or to be spaced apart from each other. At least one of the two or more emission layers may be a quantum dot-emission layer including the quantum dot, and another emission layer may be an organic emission layer including organic compounds. As such, other various modifications may be possible. The light-emitting device 1A may include a first color emission layer and a second color emission layer, and the first color and the second color may be the same color or different colors. In an embodiment, the first color and the second color may be both blue.

The emission layer may further include, in addition to the quantum dot, at least one selected from an organic compound and a semiconductor compound.

In detail, the organic compound may include a host and a dopant. The host and the dopant may include a host and a dopant that may be commonly used in organic light-emitting devices, respectively.

The semiconductor compound may be an organic and/or inorganic perovskite.

[Electron Transport Region in Interlayer 130]

The electron transport region may have: a structure consisting of a layer consisting of a single material, a structure consisting of a layer including different materials, or a structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from the emission layer in its respective stated order, but the structure of the electron transport region is not limited thereto.

The electron transport region may include a conductive metal oxide. Examples of the conductive metal oxide may include ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, PC60BM, PC70BM, Mg-doped ZnO (ZnMgO), Al-doped ZnO (AZO), Ga-doped ZnO (GZO), In-doped ZnO (IZO), Al-doped $TiO_2$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or any combination thereof.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}\text{-}[(L_{601})_{xe1}\text{-}R_{601}]_{xe21} \qquad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be the same as described in connection with Qi, xe21 may be 1, 2, 3, 4, or 5, and at least one of $Ar_{601}$, $L_{601}$, and $R_{601}$ may each independently be a u electron-deficient nitrogen-containing $C_1$-$C_{60}$ cyclic group unsubstituted or substituted with at least one $R_{10a}$.

For example, in Formula 601 when xe11 is 2 or more, two or more of $Ar_{601}$ may be linked to each other via a single bond.

In an embodiment, in Formula 601 $Ar_{601}$ may be a substituted or unsubstituted anthracene group.

In embodiments, the electron transport region may include a compound represented by Formula 601-1:

[Formula 601-1]

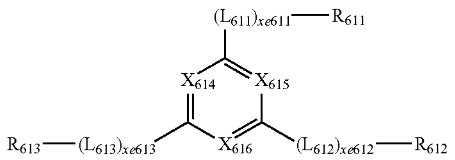

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may each be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, in Formulae 601 and 601-1 xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

-continued
ET1
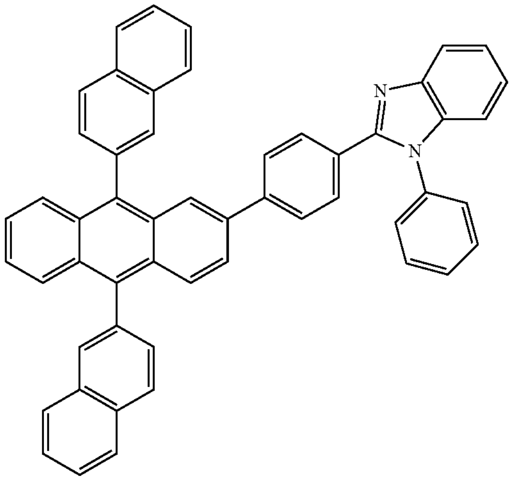
ET2
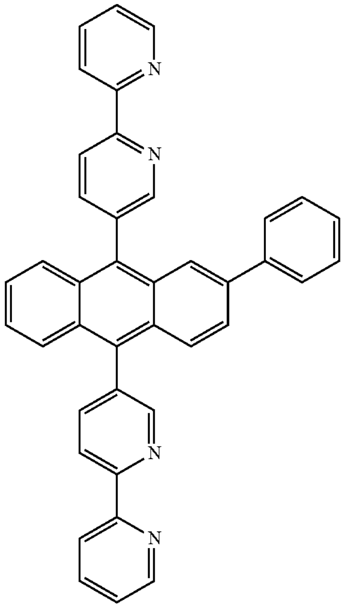
ET3
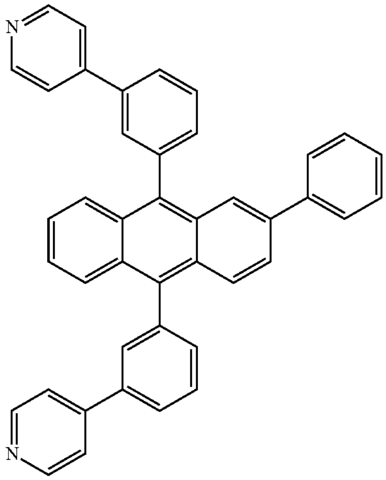
ET4
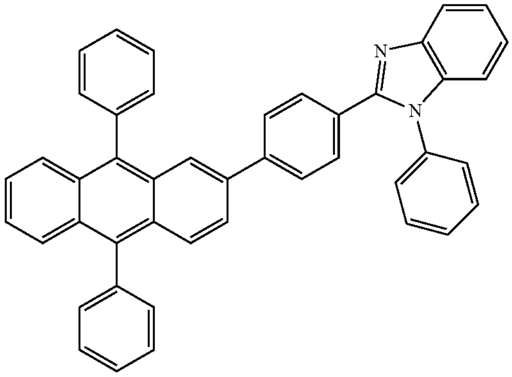
ET5
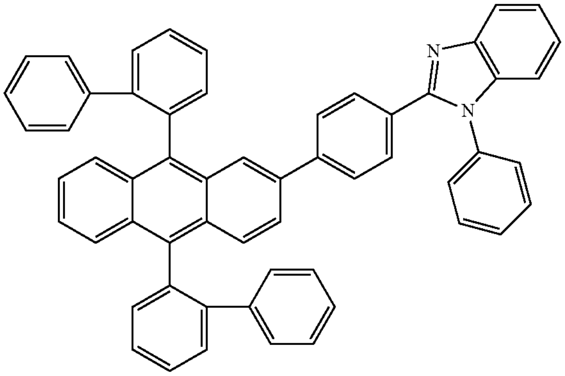
ET6
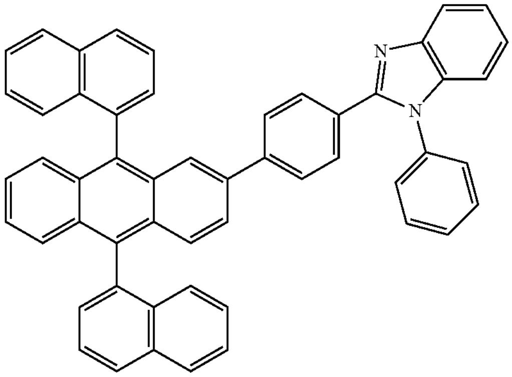

-continued
ET7
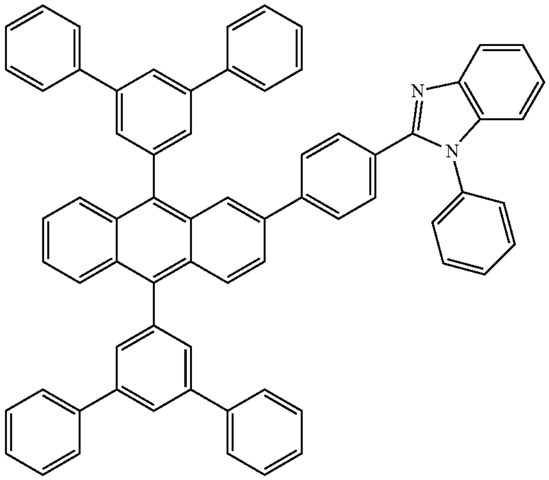
ET8
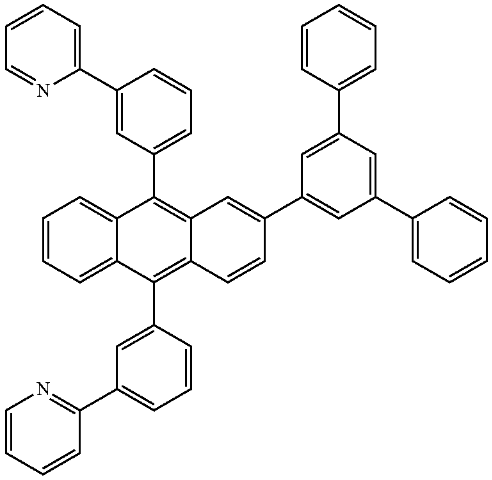
ET9
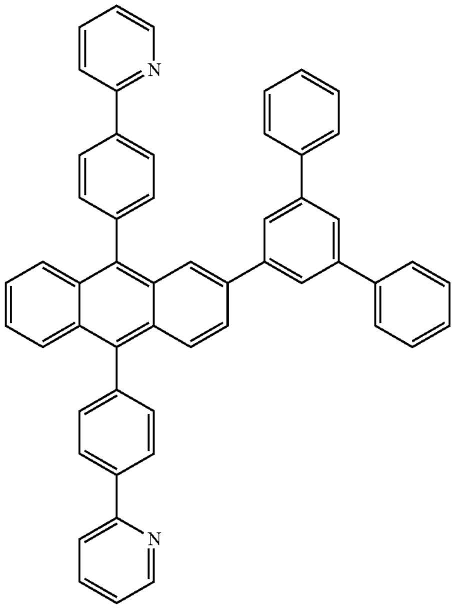
-continued
ET10
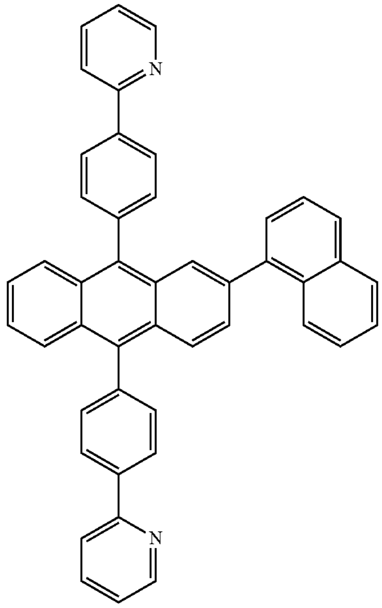
ET11
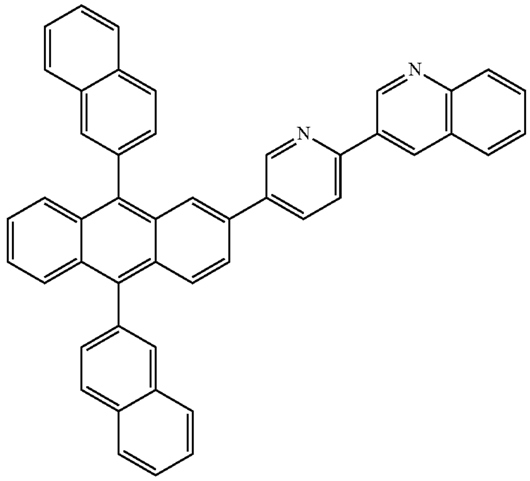
ET12
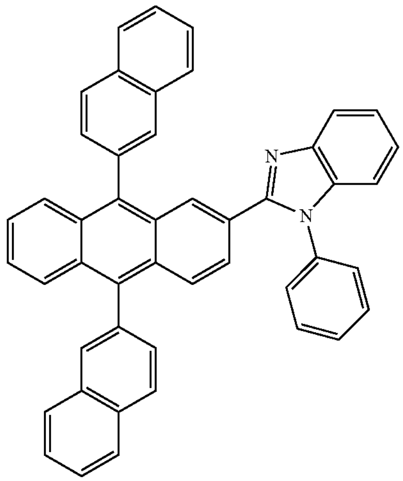

-continued
ET13
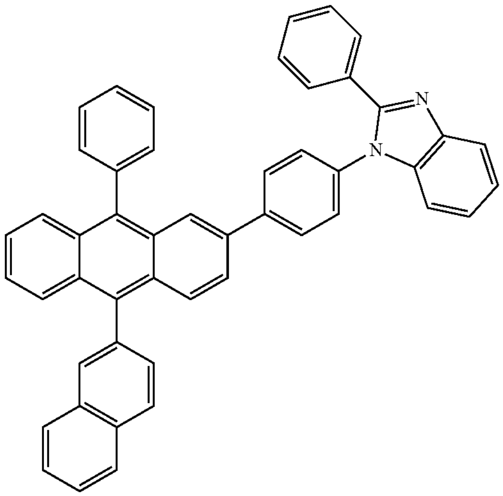
ET14
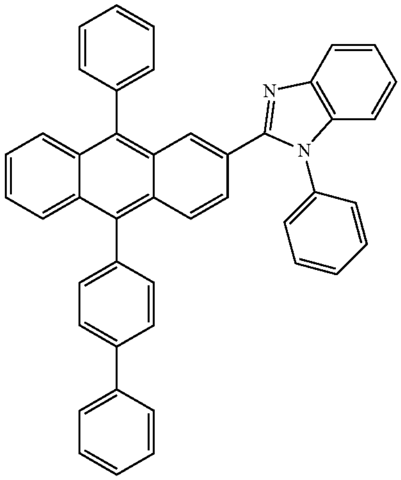
ET15
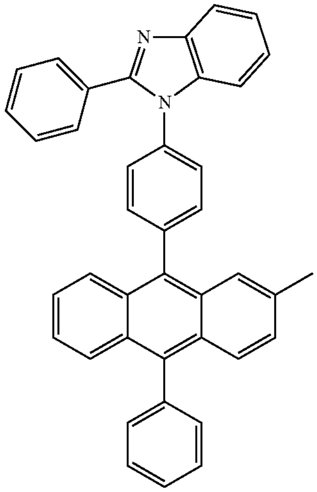
-continued
ET16
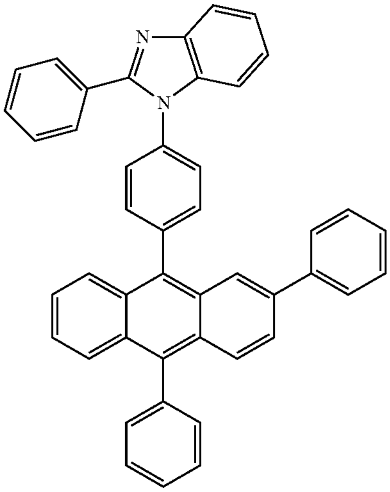
ET17
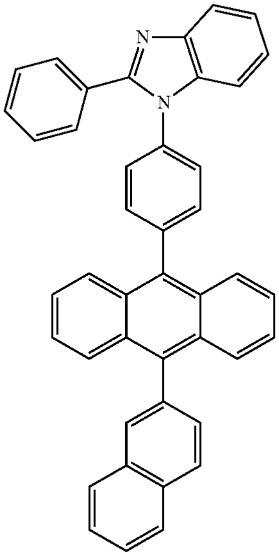
ET18
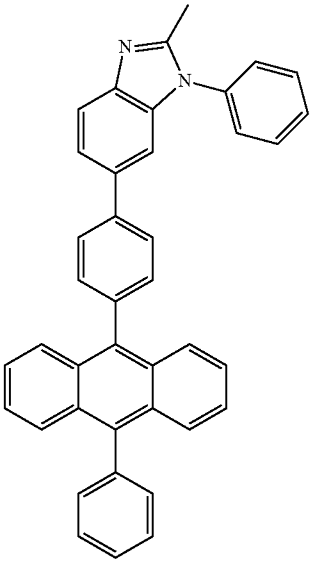

-continued
ET19
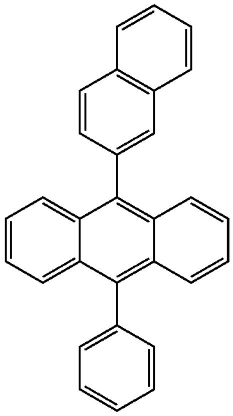
ET20
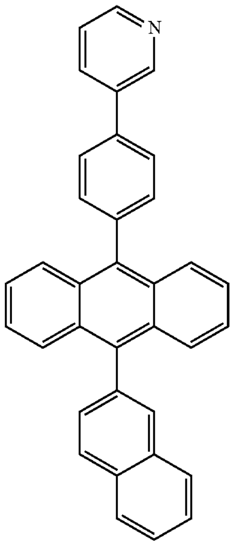
ET21
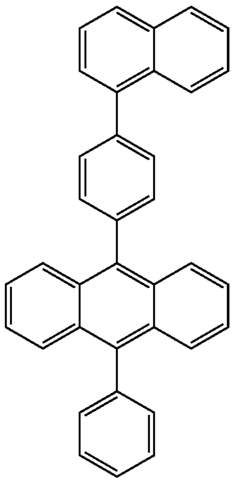
-continued
ET22
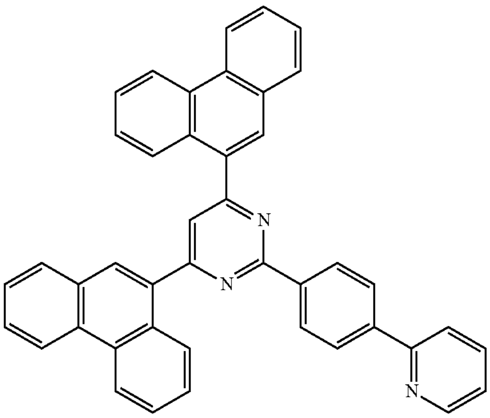
ET23
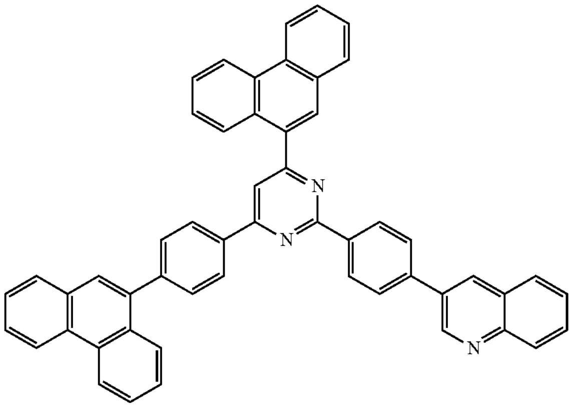
ET24
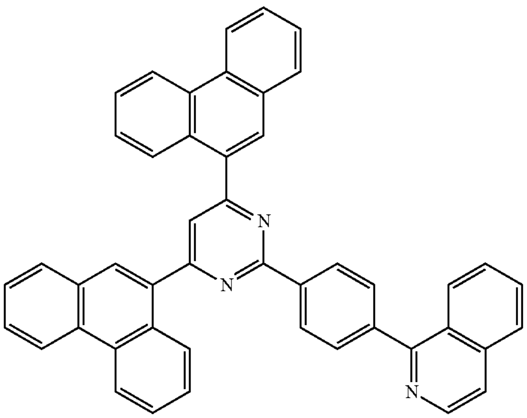

-continued
ET25
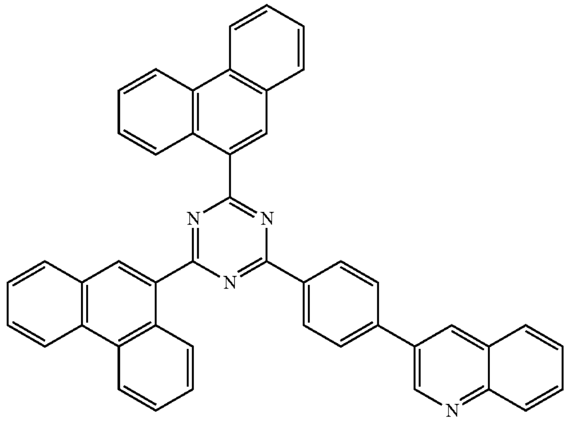
ET26
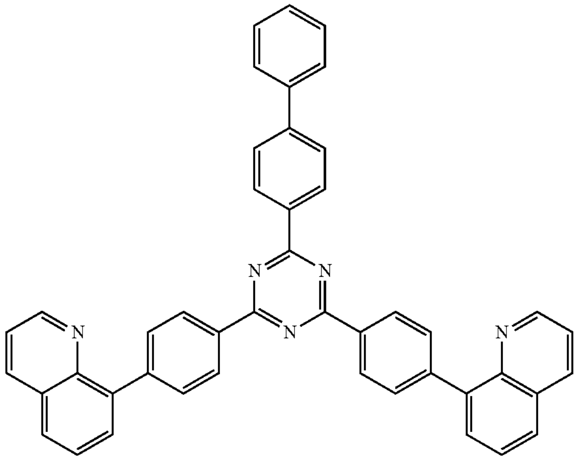
ET27
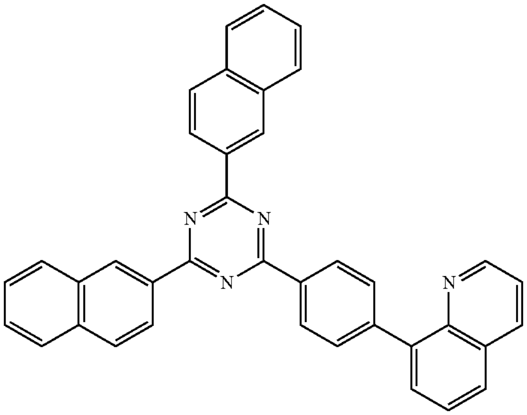
-continued
ET28
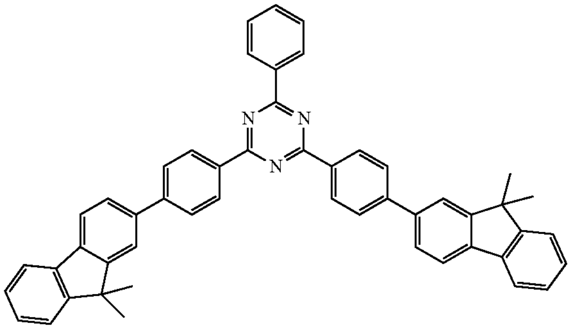
ET29
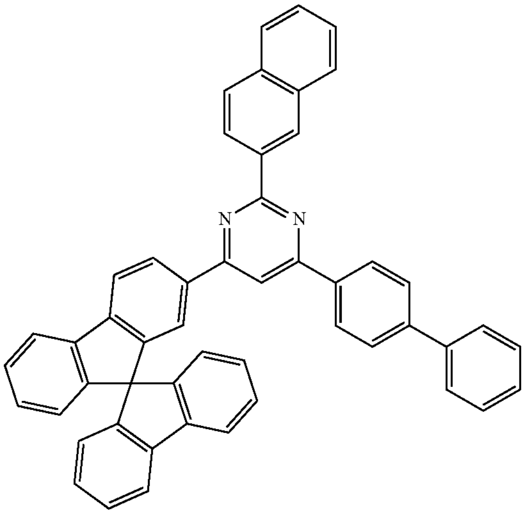
ET30
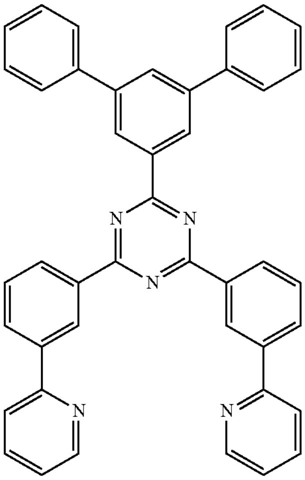

-continued
ET31
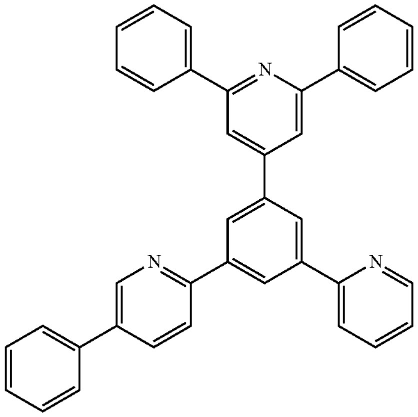
ET32
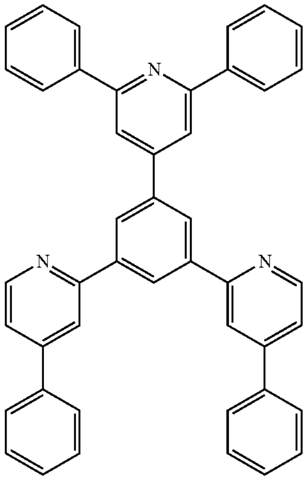
ET33
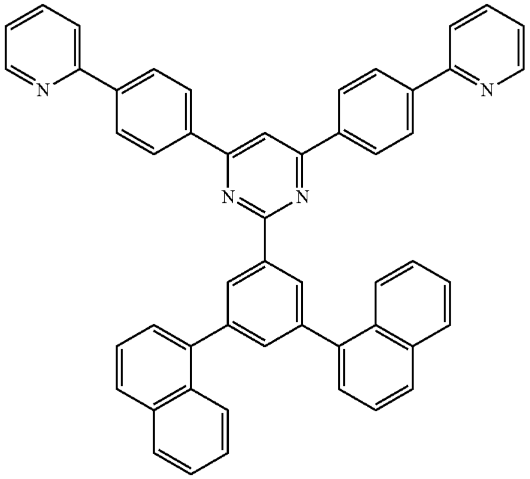
-continued
ET34
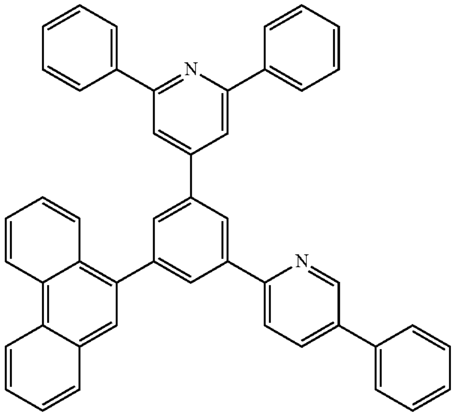
ET35
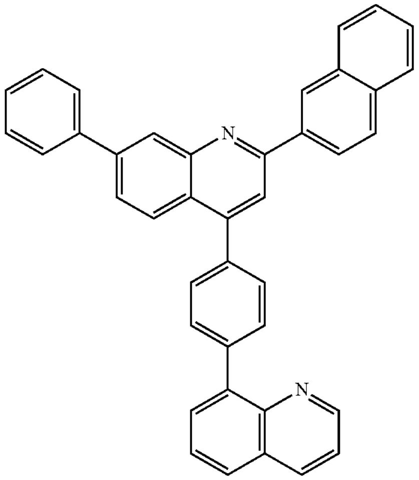
ET36
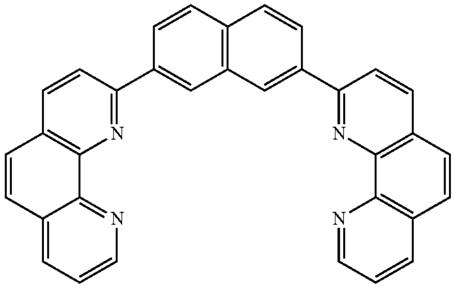
ET37
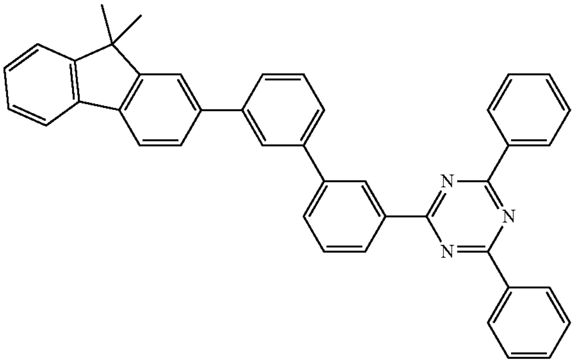

-continued
ET38
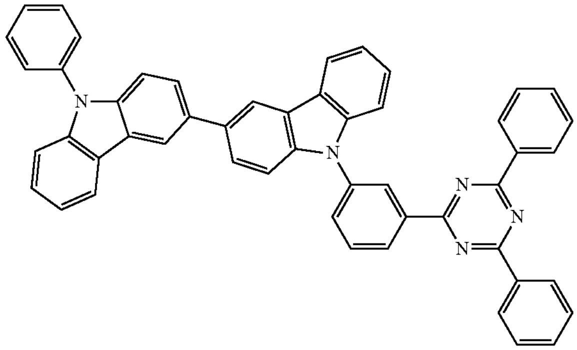
ET39
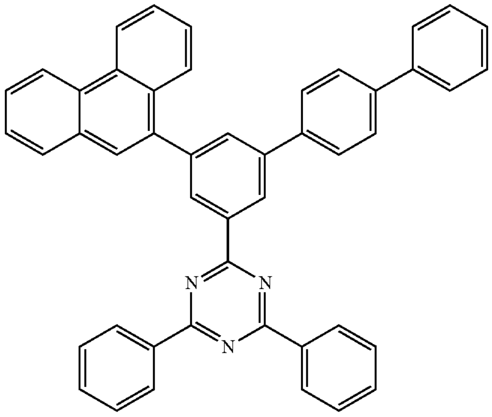
ET40
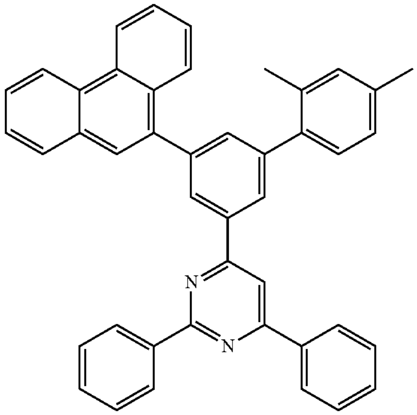
-continued
ET41
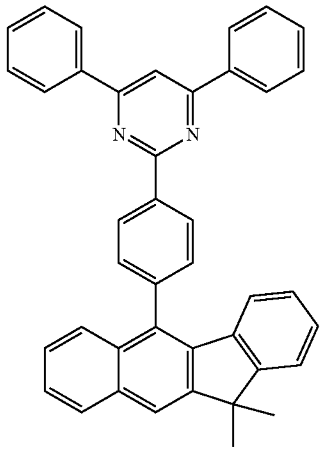
ET42
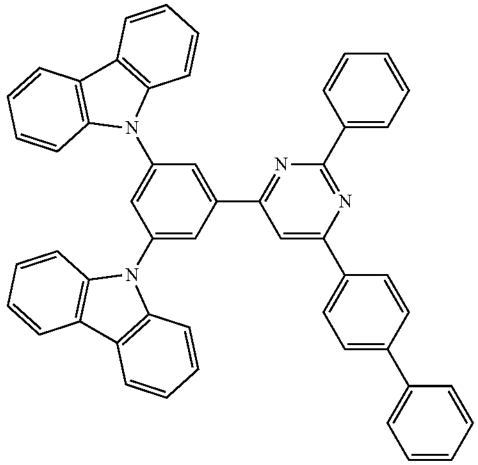
ET43
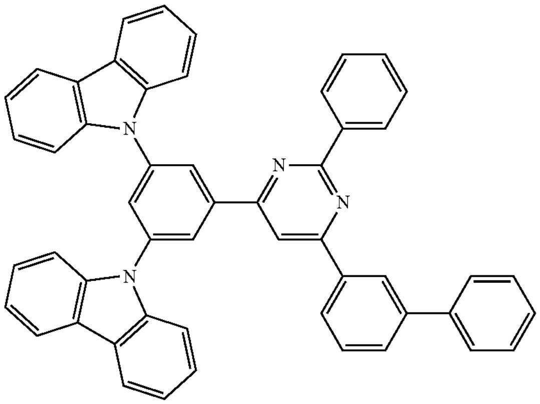

-continued

ET44

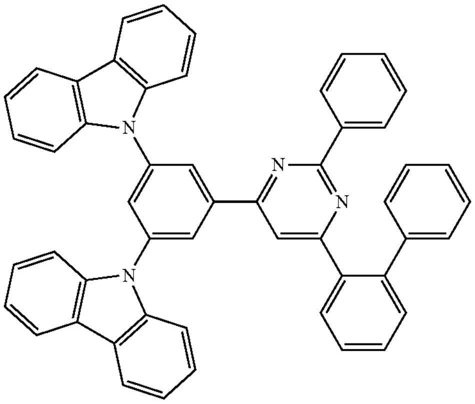

ET45

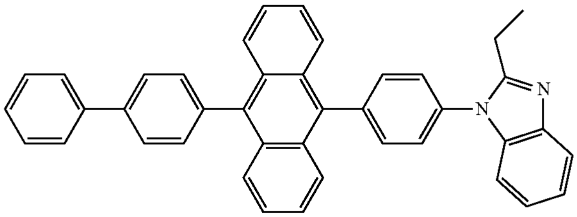

Alq3

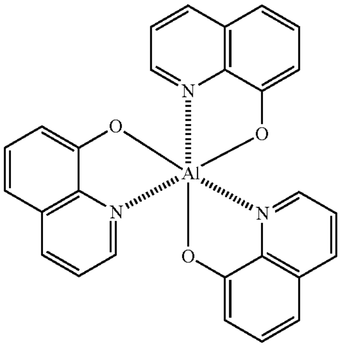

BAlq

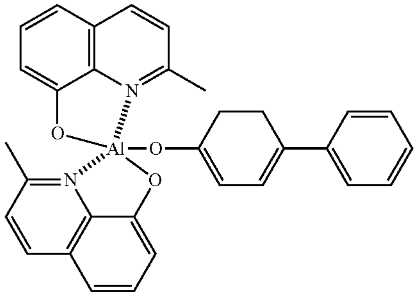

TAZ

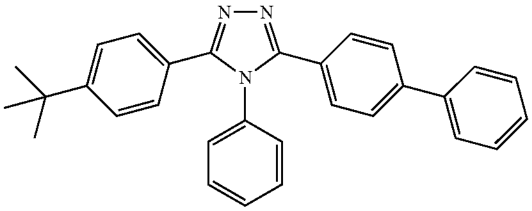

-continued

NTAZ

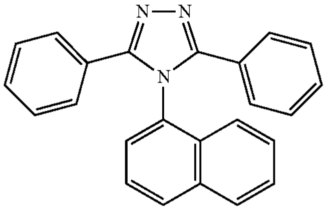

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, an electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion complex, with the metal ion of the alkali metal complex or with the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or Compound ET-D2:

ET-D1

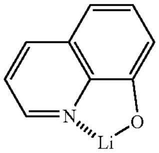

-continued

ET-D2

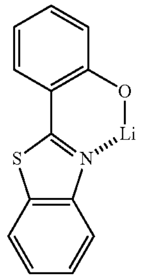

The electron transport region may include an electron injection layer that facilitates the injection of electrons from the second electrode 150. The electron injection layer may directly contact the second electrode 150.

The electron injection layer may have: a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, iodides, etc.), or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and the like; alkali metal halides, such as LiF, NaF, CsF, KF, LiI, NaI, CsI, KI, and the like; or any combination thereof. The alkaline earth metal-containing compound may include an alkaline earth metal compound, such as BaO, SrO, CaO, $BaxSr_{1-x}O$ (wherein x is a real number satisfying $0<x<1$), $Ba_xCa_{1-x}O$ (wherein x is a real number satisfying $0<x<1$), and the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include one of alkali metal ions, alkaline earth metal ions, and rare earth metal ions and a ligand bonded to the metal ion (for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof).

In an embodiment, the electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, alkali metal halide), or the electron injection layer may consist of an alkali metal-containing compound (for example, alkali metal halide), and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges above, satisfactory electron injection characteristics may be obtained without a substantial increase in driving voltage.

[Second Electrode 150]

The second electrode 150 may be on the interlayer 130 having a structure as described above. The second electrode 150 may be a cathode, which is an electron injection electrode. A material for forming the second electrode 150, may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure.

[Capping Layer]

The light-emitting device 1A may include a first capping layer outside the first electrode 110, and/or a second capping layer outside the second electrode 150. For example, the light-emitting device 1A may have a structure in which the first capping layer, the first electrode 110, the interlayer 130, and the second electrode 150 are stacked in the stated order, a structure in which the first electrode 110, the interlayer 130, the second electrode 150, and the second capping layer are stacked in the stated order, or a structure in which the first capping layer, the first electrode 110, the interlayer 130, the second electrode 150, and the second capping layer are stacked in the stated order.

Light generated in an emission layer of the interlayer 130 of the light-emitting device 1A may be extracted toward the outside through the first electrode 110 which may be a semi-transmissive electrode or a transmissive electrode, and through the first capping layer. Light generated in an emission layer of the interlayer 130 of the light-emitting device 1A may be extracted toward the outside through the second electrode 150 which may be a semi-transmissive electrode or a transmissive electrode, and through the second capping layer.

The first capping layer and the second capping layer may increase external emission efficiency according to the principle of constructive interference. Accordingly, the light extraction efficiency of the light-emitting device 1A may be increased, so that the luminescence efficiency of the light-emitting device 1A may be improved.

The first capping layer and the second capping layer may each include a material having a refractive index greater than or equal to about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

In an embodiment, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include: one of Compounds HT28 to HT33; one of Compounds CP1 to CP6; β-NPB; or any combination thereof:

CP1

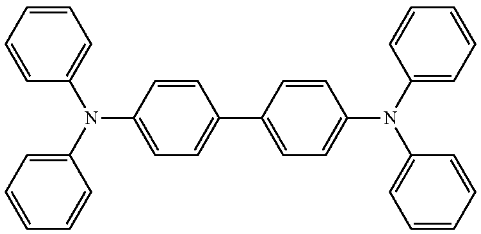

CP2

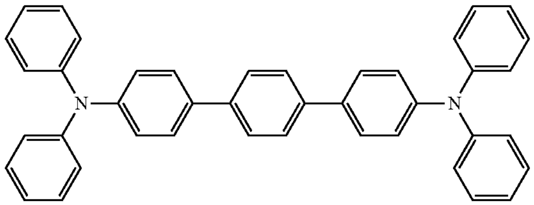

-continued

CP3

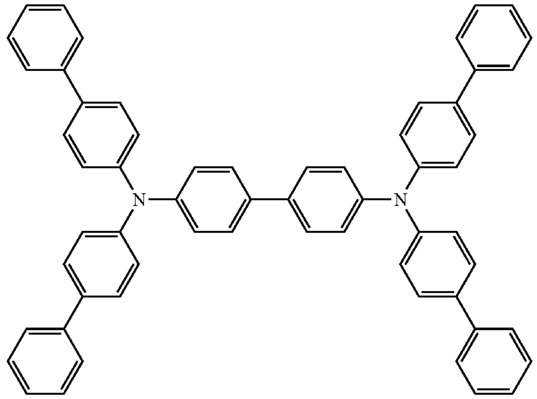

CP4

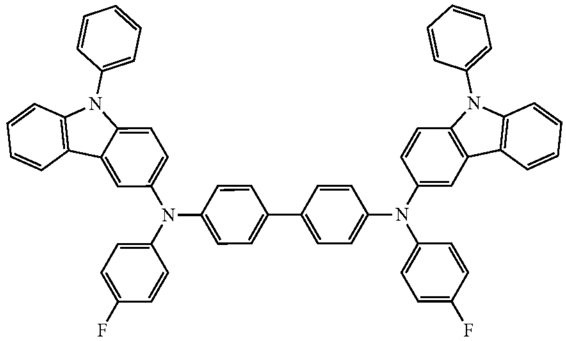

CP5

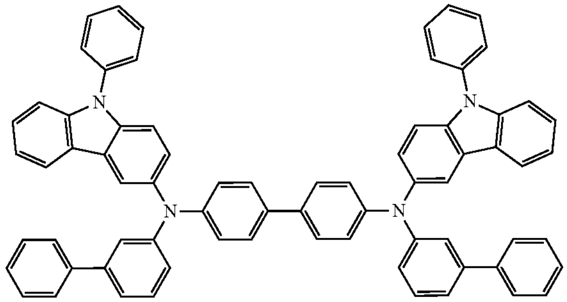

CP6

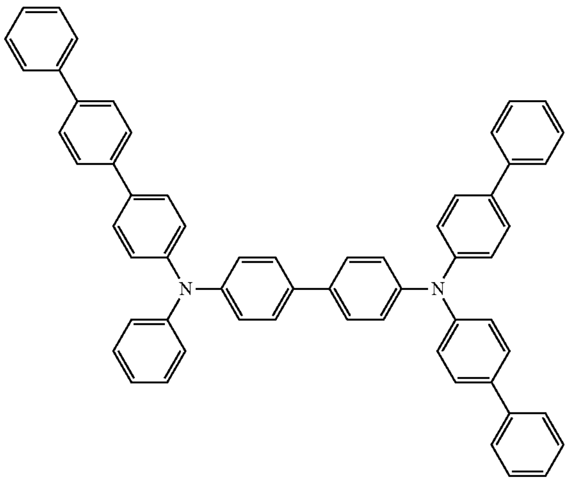

-continued

β-NPB

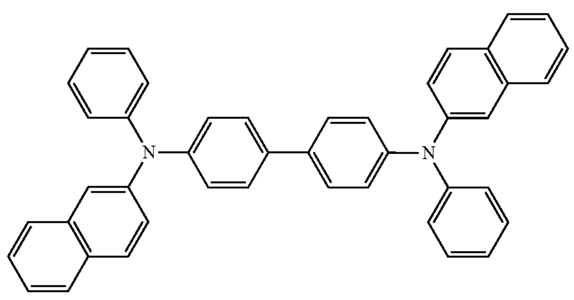

The light-emitting device may be included in various electronic apparatuses. In an embodiment, an electronic apparatus including the light-emitting device may be a light-emitting apparatus, an authentication apparatus, and the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. For example, the light emitted from the light-emitting device may be blue light or white light. The light-emitting device may be the same as described herein. In an embodiment, the color conversion layer may include a quantum dot. The quantum dot may be, for example, the same as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be between the subpixels to define each subpixel.

The color filter may further include color filter areas and light-shielding patterns located between the color filter areas, and the color conversion layer may further include color conversion areas and light-shielding patterns among the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another. In an embodiment, the first color light may be red light, the second color light may be green light, and the third color light may be blue light. In an embodiment, the plurality of color filter areas (or the plurality of color conversion areas) may include quantum dots. For example, first area may include a red quantum dot, the second area may include a green quantum dot, and the third area may not include a quantum dot. The quantum dot may be the same as described herein. The first area, the second area, and/or the third area may each further include a scatter.

In an embodiment, the light-emitting device may emit first light, the first area may absorb the first light to emit first-first color light, the second area may absorb the first light to emit second-first color light, and the third area may absorb the first light to emit third-first color light. The first-first color light, the second-first color light, and the third-first color light may have different maximum emission wavelengths. For example, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, and the like.

The activation layer may include crystalline silicon, amorphous silicon, an organic semiconductor, an oxide semiconductor, and the like.

The electronic apparatus may further include a sealing portion for sealing the light-emitting device. The sealing portion may be between the color filter and/or the color conversion layer and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. Examples of the functional layers may include a touch screen layer, a polarizing layer, an authentication apparatus and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

[Manufacturing Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon as the only ring-forming atoms and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The "cyclic group" as used herein may include both the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In embodiments, the $C_3$-$C_{60}$ carbocyclic group may be a T1 group or a cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a cyclic group in which at least two T2 groups are condensed with each other, or a cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like.), the π electron-rich $C_3$-$C_{60}$ cyclic group may be a T1 group, a cyclic group in which at least two T1 groups are condensed with each other, a T3 group, a cyclic group in which at least two T3 groups are condensed with each other, or a cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like.), the π electron-deficient nitrogen-containing $C_1$-$C_{60}$ cyclic group may be a T4 group, a cyclic group in which at least two T4 groups are condensed with each other, a cyclic group in which at least one T4 group and at least one T1 group are condensed with each other, a cyclic group in which at least one T4 group and at least one T3 group are condensed with each other, or a cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "T1 electron-rich $C_3$-$C_{60}$ cyclic group", or "T1 electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, a butenyl group, and the like. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$O(A_{101})$ (wherein $A_{101}$ may be the $C_1$-$C_{60}$ alkyl group), and examples thereof may include a methoxy group, an ethoxy group, an isopropyloxy group, and the like.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_1$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_1$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group described above.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ aryl alkyl group" as used herein may be a group represented by -($A_{104}$)($A_{105}$)(wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

In the specification, the group "$R_{10a}$" may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, $C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —CI, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

In the specification, Qi to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein may be any atom other than a carbon atom or a hydrogen atom. Examples of the heteroatom may include O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the terms "ter-Bu" or "But" as used herein each refer to a tert-butyl group, and the term "OMe" as used herein refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group." For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, compounds according to embodiments and light-emitting devices according to embodiments will be described in detail with reference to the following Synthesis Examples and Examples. The wording "B was used instead of A" used in describing Synthesis Examples means that an identical molar equivalent of B was used in place of A.

EXAMPLES

Example 1: Preparation of InGaP/ZnSe/ZnS Quantum Dots

1. Preparation of InGaP Core

Preparation of First Composition

Indium acetate as an In precursor, gallium acetate as a Ga precursor, zinc acetate as a Zn precursor, a fatty acid, and a solvent were mixed, and the reaction temperature was raised to 120° C. in a vacuum. The reaction product was degassed to prepare a first composition.

Preparation of Second Composition

Tris(trimethylsilyl)phosphine (TMSP) was mixed with a TOP solvent at a volume ratio of 1:5 to form a second composition.

Preparation of InGaP Core

A ratio of the number of moles of P in the second composition to the sum of the number of moles of In and Ga in the first composition (i.e., P/In+Ga) may be 0.77, the reaction temperature of raised to 260° C., and the temperature may be maintained to prepare InGaP core.

2. Preparation of Shell (Preparation of InGaP/ZnSe/ZnS)

27 mmol of Zn, oleic acid, and TOA were mixed, and the reaction temperature was raised to 130° C. After the vacuum state was maintained for 30 minutes, $N_2$ was purged, and the reaction temperature was raised to 230° C. and maintained for 50 minutes. After cooling, the InGaP core and a Se precursor were substantially injected, and the reaction temperature was raised to 260° C. The Se precursor was additionally split-injected, and the reaction temperature was raised to 300° C. Subsequently, the reaction product was maintained for 30 minutes after injecting a S precursor, and a cooling process was performed thereon at a temperature of 180° C. After additional injection of the S precursor, the reaction temperature was raised to 260° C. and maintained for 20 minutes, and a cooling process was performed thereon at a temperature of 200° C. or less, thereby preparing InGaP/ZnSe/ZnS quantum dots of Example 1.

Examples 2 and 3 and Comparative Examples 1 to 4

Cores and quantum dots were prepared in the same manner as in Example 1, except that, in the preparation of the quantum dot, a ratio of the number of moles of P to the sum of the number of moles of In and Ga in the first mixture ($n^P/(n^{In}\pm n^{Ga})$) and the fatty acid were used as shown in Table 1.

Figure 2:
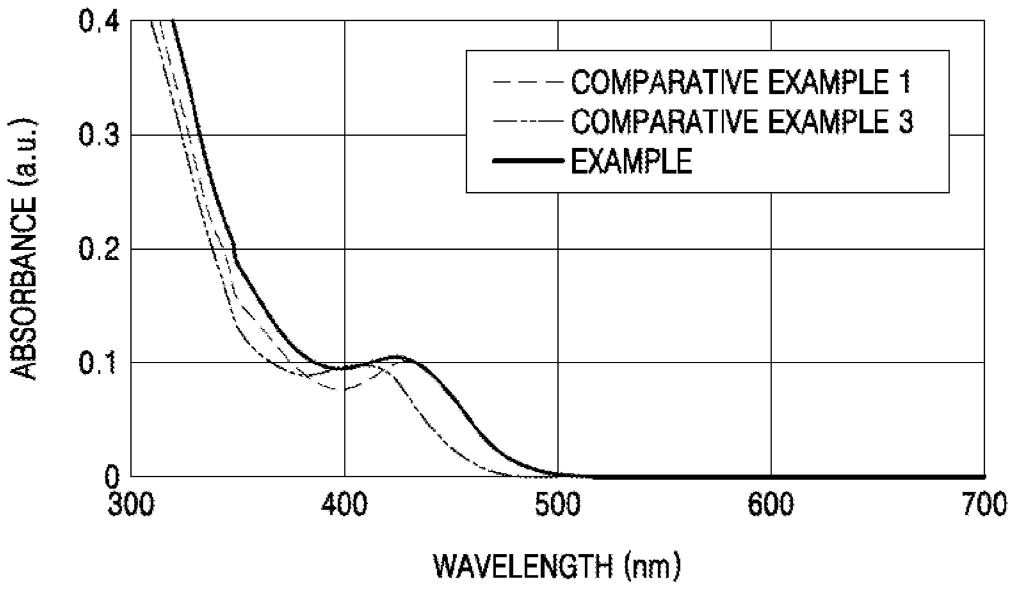
FIG. 2 is a graph showing UV-Vis spectra of cores prepared according to Example 1 and Comparative Examples 1 and 2.

Evaluation Example 1. Characteristics Evaluation of Quantum Dots According to ICP Composition Ratio of Core The diameter and ICP composition ratio of the core of the quantum dot of Examples 1 and 2 and Comparative Examples 1 to 4 and the exciton peak and weight absorption coefficient of the quantum dot were measured. The results are shown in Table 1. Here, the diameter of the core of the quantum dot was measured based on the small-angle X-ray scattering (SAXS) analysis, the ICP composition ratio was measured by using an inductively coupled plasma-mass spectrometer, and the first exciton peak was measured based on the UV of the quantum dot (a case where the first exciton peak did not exist was indicated by "X"), wherein the weight absorption coefficient was measured as described above. The UV-Vis spectra of the quantum dots of Example 1 and Comparative Examples 1 and 3 are shown in FIG. 2. (LA: lauric acid, PA: palmitic acid)

TABLE 1

| | Condition for core synthesis | | | ICP | | first | Weight absorption |
|---|---|---|---|---|---|---|---|
| | $n^P/(n^{In} + n^{Ga})$ in first mixture | Fatty acid | Condition for shell synthesis | composition ratio of core $(n^{In} + n^{Ga})/n^P$ | Diameter of core (nm) | exciton peak (nm) | coefficient (OD 450 nm) (mL $g^{-1}cm^{-1}$) |
| Example 1 | 0.77 | LA | ZnSe/ZnS | 1.30 | 2.08 | 425 | 382 |
| Example 2 | 0.66 | LA | ZnSe/ZnS | 1.61 | 2.10 | 433 | 314 |
| Comparative Example 1 | 0.54 | PA | ZnSe/ZnS | 1.92 | 2.18 | 430 | 286 |
| Comparative Example 2 | 0.66 | PA | ZnSe/ZnS | 1.67 | 2.09 | 412 | 301 |
| Comparative Example 3 | 0.77 | PA | ZnSe/ZnS | 1.40 | 2.08 | 408 | 368 |
| Comparison Example 4 | 0.82 | PA | ZnSe/ZnS | 1.21 | 2.02 | X | — |

Referring to Table 1 and FIG. 2, it was confirmed that the cores of the quantum dots according to Examples 1 and 2 exhibited high weight absorption while maintaining the first exciton peak in the range of 350 nm to 450 nm.

Evaluation Example 2. Characteristics Evaluation of Quantum Dots According to ICP Composition Ratio of Core In the crude state of the quantum dots according to Examples 1 and 2 and Comparative Examples 1 to 3, the quantum dots and EtOH were first purified at a volume ratio of 1:3, re-dispersed in toluene, additionally second purified with EtOH, and re-dispersed in toluene. Afterwards, QY was measured by using QE-2100 to measure the retention rate of the EtOH purification after shelling the core, and the results are shown in Table 2.

TABLE 2

| | Condition for core synthesis | | Condition | ICP composition | Retention rate of EtOH |
|---|---|---|---|---|---|
| | $n^P/(n^{In} + n^{Ga})$ in first mixture | Fatty acid | for shell synthesis | ratio of core (In + Ga)/P | purification after shelling |
| Example 1 | 0.77 | LA | ZnSe/ZnS | 1.30 | 93.6% |
| Example 2 | 0.66 | LA | ZnSe/ZnS | 1.61 | 92.8% |
| Comparative Example 1 | 0.54 | PA | ZnSe/ZnS | 1.92 | 93.9% |
| Comparative Example 2 | 0.66 | PA | ZnSe/ZnS | 1.67 | 86.9% |
| Comparative Example 3 | 0.77 | PA | ZnSe/ZnS | 1.40 | 77.3% |

Referring to Table 2, it was confirmed that the quantum dots according to Examples 1 and 2 showed higher or equivalent purification retention rates compared to the quantum dots according to Comparative Examples 1 to 3.

According to embodiments, a method of preparing a quantum dot may be used to prepare a quantum dot having high absorbance and high quantum efficiency while maintaining stability by adjusting the number of moles of a first element, a second element, and a fourth element.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A method of preparing a quantum dot, the method comprising:

preparing a first composition comprising:

a first precursor comprising a first element;

a second precursor comprising a second element;

a third precursor comprising a third element;

a fatty acid having a number of carbon atoms in a range of 2 to 12; and a solvent;

heating the first composition to a first temperature of 110° C. to 130° C.;

preparing a second composition comprising a fourth precursor comprising a fourth element; and preparing a core by combining the second composition with the first composition to provide a first mixture, and heating the first mixture to a second temperature greater than the first temperature, wherein the first element and the second element are each a Group III element, and the first element is different from the second element, the third element is a Group II element, the fourth element is a Group V element, wherein the core of the quantum dot comprises the first element, the second element, and the fourth element, and a number of moles of the first element is $n^1$, a number of moles of the second element is $n^2$, a number of moles of the fourth element is $n^4$, and a mole ratio of a sum of the number of moles of the first element and the number of moles of the second element to the number of moles of the fourth element in the core $(n^1+n^2)/n^4$ is in a range of about 1.0 to about 2.0.

2. The method of claim 1, further comprising:

following the preparing of the core, preparing a shell covering at least a portion of the core.

3. The method of claim 1, wherein a ratio of the number of moles of the fourth element relative to the sum of the number of moles of the first element and the number of moles of the second element in the first mixture $(n^4/(n^1+n^2))$ is in a range of about 0.5 to about 0.9.

4. The method of claim 1, wherein a first exciton peak of a UV-Vis spectrum of the core has a wavelength in a range of about 350 nm to about 450 nm.

5. The method of claim 1, wherein the first element and the second element each independently comprise scandium (Sc), aluminum (Al), gallium (Ga), indium (In), thallium (Tl), or a combination thereof.

6. The method of claim 1, wherein the third element comprises beryllium (Be), magnesium (Mg), calcium (Ca), strontium (Sr), barium (Ba), zinc (Zn), cadmium (Cd), mercury (Hg), or a combination thereof.

7. The method of claim 1, wherein the fourth element comprises vanadium (V), niobium (Nb), nitrogen (N), phosphorus (P), arsenic (As), antimony (Sb), or a combination thereof.

8. The method of claim 1, wherein the number of carbon atoms in the fatty acid is in a range of 6 to 12.

9. The method of claim 1, wherein the fatty acid comprises caprylic acid, capric acid or lauric acid.

10. The method of claim 1, wherein a number of moles of the third element is $n^3$, and a ratio of the number of moles of the third element to the number of moles of the first element in the first mixture $(n^3/n^1)$ is greater than 0 and less than or equal to 2.0.

11. The method of claim 1, wherein a ratio of the number of moles of the second element to the number of moles of the first element in the first mixture $(n^2/n^1)$ is greater than or equal to 0.05 and less than or equal to 5.

12. The method of claim 1, wherein the core is represented by Formula 1:

$$M^1_xM^2_{1-x}M^4_y \quad \text{[Formula 1]}$$

wherein in Formula 1, $M^1$ is the first element, $M^2$ is the second element, $M^4$ is the fourth element, x is a real number greater than 0 and less than 1, and y is a real number greater than 0 and less than or equal to 1, and satisfies $1.0 \leq 1/y < 2.0$.

13. The method of claim 1, wherein the core has a diameter in a range of about 1.5 nm to about 3.0 nm.

* * * * *